US010066442B2

(12) United States Patent
Patel et al.

(10) Patent No.: US 10,066,442 B2
(45) Date of Patent: Sep. 4, 2018

(54) CUTTING ELEMENTS FOR EARTH-BORING TOOLS, EARTH-BORING TOOLS INCLUDING SUCH CUTTING ELEMENTS, AND RELATED METHODS

(71) Applicant: Baker Hughes Incorporated, Houston, TX (US)

(72) Inventors: Suresh G. Patel, The Woodlands, TX (US); Danny E. Scott, Montgomery, TX (US); Rudolf Carl Pessier, Houston, TX (US)

(73) Assignee: Baker Hughes Incorporated, Houston, TX (US)

( * ) Notice: Subject to any disclaimer, the term of this patent is extended or adjusted under 35 U.S.C. 154(b) by 27 days.

(21) Appl. No.: 15/244,822

(22) Filed: Aug. 23, 2016

(65) Prior Publication Data
US 2016/0356093 A1    Dec. 8, 2016

Related U.S. Application Data

(63) Continuation of application No. 13/840,195, filed on Mar. 15, 2013, now Pat. No. 9,428,966.
(Continued)

(51) Int. Cl.
*E21B 10/567* (2006.01)
*E21B 10/55* (2006.01)
(Continued)

(52) U.S. Cl.
CPC .......... *E21B 10/5673* (2013.01); *B24D 3/008* (2013.01); *B24D 18/00* (2013.01);
(Continued)

(58) Field of Classification Search
CPC ...... E21B 10/5673; E21B 10/43; E21B 10/55; E21B 10/573; E21B 2010/425;
(Continued)

(56) References Cited

U.S. PATENT DOCUMENTS

| 4,224,380 A | 9/1980 | Bovenkerk et al. |
| 4,538,690 A | 9/1985 | Short |

(Continued)

FOREIGN PATENT DOCUMENTS

| CN | 2278759 Y | 4/1998 |
| CN | 2579580 Y | 10/2003 |

(Continued)

OTHER PUBLICATIONS

Guilin Color Engineered Diamond Technology (EDT) Co. Ltd., Brochure, Offshore Technology Conference Apr. 30-May 3, 2012.
(Continued)

*Primary Examiner* — Brad Harcourt
(74) *Attorney, Agent, or Firm* — TraskBritt

(57) ABSTRACT

A cutting element for an earth-boring tool includes a volume of superabrasive material having a cutting face and a shaped feature on the cutting face. The shaped feature may include at least one of a recess extending into the volume of superabrasive material from the cutting face and a protrusion extending outward from the cutting face. A first portion of the cutting face may have a first surface roughness, and a second portion of the cutting face may have a second surface roughness greater than the first surface roughness of the first portion of the cutting face. The volume of superabrasive material may be disposed on a substrate. Methods of forming cutting elements may include forming one or more shaped features in a cutting face of the cutting elements. Earth-boring tools may include such cutting elements.

20 Claims, 10 Drawing Sheets

Related U.S. Application Data

(60) Provisional application No. 61/771,699, filed on Mar. 1, 2013.

(51) Int. Cl.

| | | |
|---|---|---|
| *B24D 99/00* | (2010.01) | |
| *E21B 10/43* | (2006.01) | |
| *B24D 18/00* | (2006.01) | |
| *B24D 3/00* | (2006.01) | |
| C23C 16/27 | (2006.01) | |
| E21B 10/573 | (2006.01) | |
| E21B 10/42 | (2006.01) | |

(52) U.S. Cl.
CPC ............ *B24D 99/005* (2013.01); *E21B 10/43* (2013.01); *E21B 10/55* (2013.01); *C23C 16/27* (2013.01); *E21B 10/573* (2013.01); *E21B 2010/425* (2013.01)

(58) Field of Classification Search
CPC . E21B 2010/561; E21B 10/567; B24D 3/008; B24D 18/00; B24D 99/005; C23C 16/27
See application file for complete search history.

(56) References Cited

U.S. PATENT DOCUMENTS

| | | |
|---|---|---|
| 4,539,018 A | 9/1985 | Whanger |
| 4,558,753 A | 12/1985 | Barr |
| 4,593,777 A | 6/1986 | Barr |
| 4,629,373 A | 12/1986 | Hall |
| 4,858,707 A | 8/1989 | Jones et al. |
| 4,872,520 A | 10/1989 | Nelson |
| 4,984,642 A | 1/1991 | Renard et al. |
| 4,997,049 A | 3/1991 | Tank et al. |
| 5,007,207 A | 4/1991 | Phaal et al. |
| 5,027,912 A | 7/1991 | Juergens |
| 5,054,246 A | 10/1991 | Phaal et al. |
| 5,078,219 A | 1/1992 | Morrell et al. |
| 5,127,923 A | 7/1992 | Bunting et al. |
| 5,172,778 A | 12/1992 | Tibbitts |
| 5,333,699 A | 8/1994 | Thigpen |
| 5,351,772 A | 10/1994 | Smith |
| 5,355,969 A | 10/1994 | Hardy et al. |
| 5,377,773 A | 1/1995 | Tibbitts |
| 5,437,343 A | 8/1995 | Cooley et al. |
| 5,447,208 A | 9/1995 | Lund et al. |
| 5,449,048 A | 9/1995 | Thigpen et al. |
| 5,533,582 A | 7/1996 | Tibbitts |
| 5,549,171 A | 8/1996 | Mensa et al. |
| 5,569,000 A | 10/1996 | Littecke et al. |
| 5,607,024 A | 3/1997 | Keith |
| 5,653,300 A | 8/1997 | Lund et al. |
| 5,881,830 A | 3/1999 | Cooley |
| 5,890,552 A | 4/1999 | Scott et al. |
| 5,944,129 A | 8/1999 | Jensen |
| 5,967,250 A | 10/1999 | Lund et al. |
| 5,984,005 A | 11/1999 | Hart |
| 6,006,846 A | 12/1999 | Tibbitts et al. |
| 6,026,919 A | 2/2000 | Thigpen et al. |
| 6,045,440 A | 4/2000 | Johnson et al. |
| 6,050,354 A | 4/2000 | Pessier et al. |
| 6,059,054 A | 5/2000 | Portwood et al. |
| 6,065,554 A | 5/2000 | Taylor et al. |
| 6,068,071 A | 5/2000 | Jurewicz et al. |
| 6,145,608 A | 11/2000 | lund et al. |
| 6,164,394 A | 12/2000 | Mensa-Wilmot et al. |
| 6,187,068 B1 | 2/2001 | Frushour et al. |
| 6,196,340 B1 | 3/2001 | Jensen et al. |
| 6,196,910 B1 | 3/2001 | Johnson et al. |
| 6,202,770 B1 | 3/2001 | Jurewicz et al. |
| 6,202,771 B1 | 3/2001 | Scott et al. |
| 6,216,805 B1 | 4/2001 | Lays et al. |
| 6,220,376 B1 | 4/2001 | Lundell |
| 6,227,319 B1 | 5/2001 | Radford |
| 6,328,117 B1 | 12/2001 | Berzas et al. |
| 6,450,271 B1 | 9/2002 | Tibbitts et al. |
| 6,488,106 B1 | 12/2002 | Dourfaye |
| 6,524,363 B2 | 2/2003 | Gates, Jr. et al. |
| 6,527,065 B1 | 3/2003 | Tibbitts et al. |
| 6,550,556 B2 | 4/2003 | Middlemiss et al. |
| 6,935,444 B2 | 8/2005 | Lund et al. |
| 6,962,218 B2 | 11/2005 | Eyre |
| 7,000,715 B2 | 2/2006 | Sinor et al. |
| 7,188,692 B2 | 3/2007 | Lund et al. |
| 7,363,992 B2 | 4/2008 | Stowe et al. |
| 7,373,998 B2 | 5/2008 | Cariveau et al. |
| D570,384 S | 6/2008 | Morozov |
| 7,493,972 B1 | 2/2009 | Schmidt et al. |
| 7,533,740 B2 | 5/2009 | Zhang et al. |
| 7,740,090 B2 | 6/2010 | Shen et al. |
| 7,757,790 B1 | 7/2010 | Schmidt et al. |
| 7,814,998 B2 | 10/2010 | Patel et al. |
| 7,861,808 B2 | 1/2011 | Zhang et al. |
| 8,016,054 B2 | 9/2011 | Lancaster et al. |
| 8,061,456 B2 | 11/2011 | Patel et al. |
| 8,191,656 B2 | 6/2012 | Dourfaye et al. |
| 8,210,288 B2 | 7/2012 | Chen et al. |
| 8,240,405 B2 | 8/2012 | Lancaster et al. |
| 8,469,121 B2 | 6/2013 | Lancaster et al. |
| 8,684,112 B2 | 4/2014 | DiGiovanni et al. |
| 8,739,904 B2 | 6/2014 | Patel |
| D712,941 S | 9/2014 | Mo |
| 8,833,492 B2 | 9/2014 | Durairajan et al. |
| 2004/0009376 A1 | 1/2004 | Wan et al. |
| 2005/0247492 A1 | 11/2005 | Shen et al. |
| 2005/0269139 A1 | 12/2005 | Shen et al. |
| 2006/0201712 A1 | 9/2006 | Zhang et al. |
| 2007/0235230 A1 | 10/2007 | Cuillier et al. |
| 2008/0006448 A1 | 1/2008 | Zhang et al. |
| 2008/0035380 A1 | 2/2008 | Hall et al. |
| 2008/0164071 A1 | 7/2008 | Patel et al. |
| 2008/0264696 A1 | 10/2008 | Dourfaye et al. |
| 2008/0308321 A1 | 12/2008 | Aliko et al. |
| 2009/0008155 A1 | 1/2009 | Sherwood, Jr. |
| 2009/0057031 A1 | 3/2009 | Patel et al. |
| 2009/0114628 A1 | 5/2009 | DiGiovanni |
| 2009/0260877 A1 | 10/2009 | Wirth |
| 2009/0321146 A1 | 12/2009 | Dick et al. |
| 2010/0084198 A1 | 4/2010 | Durairajan et al. |
| 2010/0104874 A1 | 4/2010 | Yong et al. |
| 2010/0108403 A1* | 5/2010 | Keshavan ............... C22C 26/00 175/428 |
| 2010/0243337 A1 | 9/2010 | Scott |
| 2010/0276200 A1 | 11/2010 | Schwefe et al. |
| 2010/0288564 A1 | 11/2010 | Dovalina, Jr. et al. |
| 2010/0307829 A1 | 12/2010 | Patel |
| 2010/0326741 A1 | 12/2010 | Patel |
| 2010/0326742 A1 | 12/2010 | Vempati et al. |
| 2011/0000714 A1 | 1/2011 | Durairajan et al. |
| 2011/0031030 A1 | 2/2011 | Shen et al. |
| 2011/0031031 A1 | 2/2011 | Vempati et al. |
| 2011/0031036 A1 | 2/2011 | Patel |
| 2011/0088950 A1 | 4/2011 | Scott et al. |
| 2011/0171414 A1 | 7/2011 | Sreshta et al. |
| 2011/0259642 A1 | 10/2011 | DiGiovanni et al. |
| 2011/0303466 A1 | 12/2011 | DiGiovanni |
| 2012/0037431 A1 | 2/2012 | DiGiovanni et al. |
| 2012/0205162 A1 | 8/2012 | Patel et al. |
| 2013/0068534 A1 | 3/2013 | DiGiovanni et al. |
| 2013/0068537 A1 | 3/2013 | DiGiovanni |
| 2013/0068538 A1 | 3/2013 | DiGiovanni et al. |
| 2013/0292188 A1 | 11/2013 | Bilen et al. |
| 2014/0238753 A1 | 8/2014 | Nelms et al. |
| 2014/0246253 A1 | 9/2014 | Patel et al. |
| 2016/0069140 A1 | 3/2016 | Patel et al. |

FOREIGN PATENT DOCUMENTS

| | | |
|---|---|---|
| CN | 1714224 A | 12/2005 |
| CN | 201024900 Y | 2/2008 |
| CN | 201202408 Y | 3/2009 |
| EP | 546725 A1 | 9/1996 |
| EP | 835981 A2 | 4/1998 |

(56) References Cited

FOREIGN PATENT DOCUMENTS

| EP | 656458 B1 | 2/1999 |
|---|---|---|
| EP | 979699 A1 | 2/2000 |
| WO | 9415058 A1 | 7/1994 |
| WO | 9427769 A1 | 12/1994 |
| WO | 0048789 A1 | 8/2000 |
| WO | 0160554 A1 | 8/2001 |
| WO | 2008006010 A3 | 5/2008 |

OTHER PUBLICATIONS

Guilin Star Diamond Superhard Material Co. Ltd., Brochure, Offshore Technology Conference Apr. 30-May 3, 2012.
Pilkey in Peterson's Stress Concentration Factors (2d ed., Wiley Interscience 1997), in Section 2.6.6, on p. 71 (1997).

\* cited by examiner

CUTTING ELEMENTS FOR EARTH-BORING TOOLS, EARTH-BORING TOOLS INCLUDING SUCH CUTTING ELEMENTS, AND RELATED METHODS

CROSS-REFERENCE TO RELATED APPLICATIONS

This application is a continuation of U.S. patent application Ser. No. 13/840,195, filed Mar. 15, 2013, now U.S. Pat. No. 9,428,966, issued Aug. 30, 2016, the disclosure of which is hereby incorporated herein in its entirety by this reference. This application claims the benefit of the filing date of U.S. Provisional Patent Application No. 61/771,699, filed Mar. 1, 2013, the disclosure of which is hereby incorporated herein in its entirety by this reference. The subject matter of this patent application is related to the subject matter of U.S. patent application Ser. No. 13/477,905, filed May 22, 2012, now U.S. Pat. No. 9,243,452, issued Jan. 26, 2016, in the name of DiGiovanni et al.; and to the subject matter of U.S. patent application Ser. No. 13/472,377, filed May 15, 2012, now U.S. Pat. No. 9,482,057, issued Nov. 1, 2016, in the name of DiGiovanni et al.; and to the subject matter of U.S. patent application Ser. No. 13/461,388, filed May 1, 2012, now U.S. Pat. No. 8,991,525, issued Mar. 31, 2015, in the name of Bilen et al.; and to the subject matter of U.S. Patent Publication No. 2011/0259642 A1, published on Oct. 27, 2011, in the name DiGiovanni et al., the disclosure of each of which is incorporated herein in its entirety by this reference.

TECHNICAL FIELD

Embodiments of the present disclosure relate to earth-boring tools, cutting elements for such earth-boring tools, and related methods.

BACKGROUND

Wellbores are formed in subterranean formations for various purposes including, for example, extraction of oil and gas from the subterranean formation and extraction of geothermal heat from the subterranean formation. Wellbores may be formed in a subterranean formation using a drill bit such as, for example, an earth-boring rotary drill bit. Different types of earth-boring rotary drill bits are known in the art including, for example, fixed-cutter bits (which are often referred to in the art as "drag" bits), rolling-cutter bits (which are often referred to in the art as "rock" bits), diamond-impregnated bits, and hybrid bits (which may include, for example, both fixed cutters and rolling cutters). The drill bit is rotated and advanced into the subterranean formation. As the drill bit rotates, the cutters or abrasive structures thereof cut, crush, shear, and/or abrade away the formation material to form the wellbore. A diameter of the wellbore drilled by the drill bit may be defined by the cutting structures disposed at the largest outer diameter of the drill bit.

The drill bit is coupled, either directly or indirectly, to an end of what is referred to in the art as a "drill string," which comprises a series of elongated tubular segments connected end-to-end that extends into the wellbore from the surface of the formation. Often various tools and components, including the drill bit, may be coupled together at the distal end of the drill string at the bottom of the wellbore being drilled. This assembly of tools and components is referred to in the art as a "bottom-hole assembly" (BHA).

The drill bit may be rotated within the wellbore by rotating the drill string from the surface of the formation, or the drill bit may be rotated by coupling the drill bit to a downhole motor, which is also coupled to the drill string and disposed proximate the bottom of the wellbore. The downhole motor may run concentric or eccentric to the drill string. The downhole motor may comprise, for example, a hydraulic Moineau-type motor having a shaft, to which the drill bit is mounted, that may be caused to rotate by pumping fluid (e.g., drilling mud or fluid) from the surface of the formation down through the center of the drill string, through the hydraulic motor, out from nozzles in the drill bit, and back up to the surface of the formation through the annular space between the outer surface of the drill string and the exposed surface of the formation within the wellbore.

BRIEF SUMMARY

This summary does not identify key features or essential features of the claimed subject matter, nor does it limit the scope of the claimed subject matter in any way.

In some embodiments, the present disclosure includes a cutting element for an earth-boring tool, comprising a substrate and a volume of superabrasive material disposed on the substrate. The volume of superabrasive material includes a cutting face having a shaped feature. The shaped feature includes at least one of a recess extending into the volume of superabrasive material from the cutting face and a protrusion extending outward from the cutting face. A first portion of the cutting face has a first surface roughness, and a second portion of the cutting face has a surface roughness greater than the first surface roughness of the first portion of the cutting face.

In some embodiments, earth-boring tools may include one or more such cutting elements.

In additional embodiments, the present disclosure includes an earth-boring tool comprising at least one cutting element affixed to a tool body. The at least one cutting element comprises a substrate and a volume of superabrasive material disposed on the substrate. The volume of superabrasive includes a cutting face configured to generate at least two discrete streams of formation cuttings when the at least one cutting element is used to cut a subterranean formation. The cutting face includes a first portion having a first surface roughness and a second portion having a second surface roughness greater than the first surface roughness. The cutting face is further configured such that each of the at least two discrete streams of formation cuttings will slide at least partially across the first portion of the cutting face when the at least one cutting element and the earth-boring tool are used to cut a subterranean formation.

In additional embodiments, the present disclosure includes methods of making and using such cutting elements and earth-boring tools. For example, the present disclosure includes a method of forming a cutting element for an earth-boring tool. The method comprises disposing a volume of superabrasive material on a substrate and forming a cutting face comprising a shaped feature on the volume of superabrasive material. The shaped feature includes at least one of a recess extending into the volume of superabrasive material from the cutting face and a protrusion extending outward from the cutting face. The method also includes providing a first portion of the volume of superabrasive material having a first surface roughness, and providing a second portion of the volume of superabrasive material having a second surface roughness greater than the first surface roughness of the first portion.

Yet further embodiments of the present disclosure include forming a cutting element using a method as described herein, and attaching the cutting element to a body of an earth-boring tool.

BRIEF DESCRIPTION OF THE DRAWINGS

While the specification concludes with claims particularly pointing out and distinctly claiming what are regarded as embodiments of the present disclosure, various features and advantages of this disclosure may be more readily ascertained from the following description of example embodiments of the disclosure provided with reference to the accompanying drawings.

DETAILED DESCRIPTION

Figure 1:
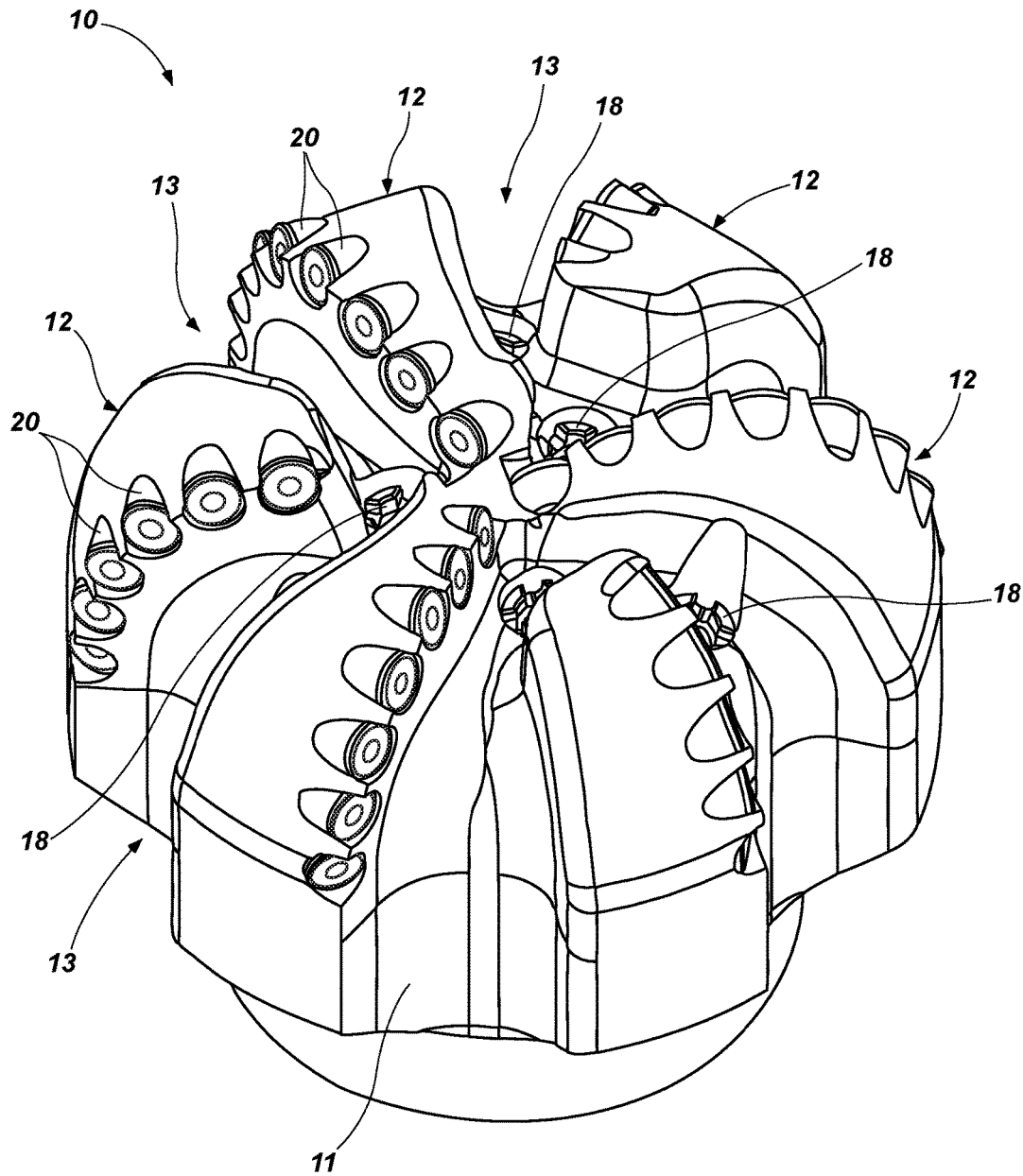
FIG. 1 illustrates a perspective view of an earth-boring tool comprising a fixed-cutting rotary drill bit, which includes cutting elements as described herein attached to a body of the drill bit, according to an embodiment of the present disclosure.

The illustrations presented herein are not actual views of any particular earth-boring tool, drill bit, cutting element, or component of such a tool or bit, but are merely idealized representations which are employed to describe embodiments of the present disclosure.

As used herein, the term "earth-boring tool" means and includes any tool used to remove formation material and form a bore (e.g., a wellbore) through the formation by way of the removal of the formation material. Earth-boring tools include, for example, rotary drill bits (e.g., fixed-cutter or "drag" bits and roller cone or "rock" bits), hybrid bits including both fixed cutters and roller elements, coring bits, percussion bits, bi-center bits, reamers (including expandable reamers and fixed-wing reamers), and other so-called "hole-opening" tools, etc.

As used herein, the term "cutting element" means and includes any element of an earth-boring tool that is used to cut or otherwise disintegrate formation material when the earth-boring tool is used to form or enlarge a bore in the formation.

As used herein, the term "cutting face" means and includes any configuration of a front cutting face of a cutting element for engaging a subterranean formation, including a planar cutting face, a non-planar cutting face, a three-dimensional cutting face, a faceted cutting face, a non-contiguous cutting face, or any combination of such cutting face types.

As used herein, the term "polish," and any derivative thereof, when used to describe a condition of a surface of a volume of superabrasive material or a substrate of a cutting element, means and includes any of the methods and/or processes disclosed herein to provide a surface having a surface roughness less than about 10 μin. (about 0.254 μm) root mean square (RMS) (all surface finishes referenced herein being RMS).

A cutting element having a polished cutting face produces smoother cuttings, or "chips," as it engages formation material during a drilling operation. A cutting element having recesses and/or protrusions in the front cutting face, as described in more detail below, is believed to provide one or more of several different advantages during use of such cutting elements in a drilling operation. For example, the inventors have discovered that a non-planar cutting face, or a cutting face with a shaped feature, has the affect of modifying the direction of chip flow off the cutting face of a cutting element, in particular, by generating at least two discrete streams of formation cuttings. Furthermore, as described in the aforementioned U.S. patent application Ser. No. 13/472,377, filed May 15, 2012 in the name of DiGiovanni et al., such recesses and/or protrusions may also be used to reduce sticking of formation cuttings to a front cutting face of a cutting element, which may reduce the occurrence of build-up, or "balling," as the term is also known in the art, of formation material in front of the cutting element and maintain efficient removal of formation cuttings during use. Larger, irregular-shaped, and rough cuttings may also cause deleterious build-up or balling of formation material at locations of a downhole assembly up-hole from a pilot drill bit. In some drilling operations, such as horizontal shale drilling, the rate-of-penetration (ROP) is often the limited by the amount of balling occurring downhole. The ability to generate formation cuttings composed of smaller, smoother chips, and to divert those cuttings into at least two (2) discrete streams as they move across the cutting face may reduce deleterious downhole effects, such as sticking, build-up and/or balling, which may significantly reduce the amount of power required to drill through a subterranean formation. Additionally, the presence of such recesses and/or protrusions in the cutting face may allow for the management of (e.g., reduction of) thermal energy within the volume of superabrasive material during drilling, which thermal energy may result in degradation of the superabrasive material.

FIG. 1 illustrates an embodiment of an earth-boring tool according to an embodiment of the present disclosure. The earth-boring tool of FIG. 1 is a fixed-cutter rotary drill bit 10 having a bit body 11 that includes a plurality of blades 12 that project outwardly from the bit body 11 and are separated from one another by fluid courses 13. The portions of the fluid courses 13 that extend along the radial sides (the "gage" areas of the drill bit 10) are often referred to in the art as "junk slots." The bit body 11 further includes a generally cylindrical internal fluid plenum, and fluid passageways that extend through the bit body 11 to the exterior surface of the bit body 11. Nozzles 18 may be secured within the fluid passageways proximate the exterior surface of the bit body 11 for controlling the hydraulics of the drill bit 10 during drilling. A plurality of cutting elements 20, various embodiments of which are described in further detail herein below, may be mounted to one or more of the blades 12.

During a drilling operation, the drill bit 10 may be coupled to a drill string (not shown). As the drill bit 10 is rotated within the wellbore, drilling fluid may be pumped down the drill string, through the internal fluid plenum and fluid passageways within the bit body 11 of the drill bit 10, and out from the drill bit 10 through the nozzles 18. Formation cuttings generated by the cutting elements 20 of the drill bit 10 may be carried with the drilling fluid through the fluid courses 13, around the drill bit 10, and back up the wellbore through the annular space within the wellbore outside the drill string.

Figure 2:
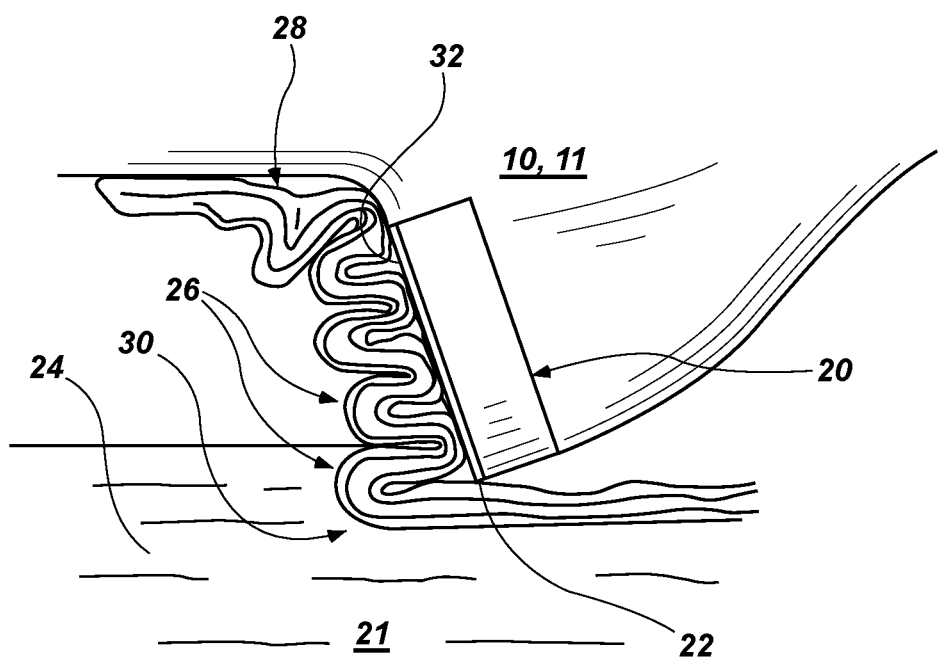
FIG. 2 illustrates a side elevation view of a cutting element having an unpolished cutting face as it engages and cuts a subterranean formation, depicting the manner in which formation chips cut from the formation can build up ahead of the cutting face and impede the cutting process and removal of chips from the cutting element.

However, the deleterious downhole phenomena previously described may prevent formation cuttings generated by the cutting elements 20 from being carried with the drilling fluid back up the wellbore. The use of unpolished cutting elements 20 on the drill bit 10 may result in formation cuttings sticking to the cutting face of the cutting element 20. FIG. 2 illustrates a prior art cutting element having a planar, unpolished cutting face engaging and cutting a subterranean formation 21. It may be seen that the cutting edge 22 is impeded from engaging the pristine or completely uncut portion 24 of formation 21 by virtue of the large build-up of formation cuttings 26 ahead of cutting face 32 and under the cutting edge 22. The irregular formation chip 28, which ultimately extends from the build-up 26 on the leading face 32 of cutting element 10, is actually more or less extruded from the massive build-up of formation chips riding against the face 32 of the cutting element 20, and not cut directly from the formation 21, so failure of the formation material occurs at area 30. It is thus readily apparent that this undesirable build-up of formation material in advance of the cutting elements mounted across the face of the rotary drag bit impairs the cutting action of the cutting element as the cutting process can actually be effected by this built-up mass of cuttings moving ahead of the actual cutting element itself.

Thus, the normal force, or in real terms the "weight-on-bit" (WOB), which needs to be applied to the bit to effect a desired depth-of-cut (DOC) and rate-of-penetration (ROP) through the formation must be made undesirably and, in some cases, unreasonably high as a result of sticking, build-up and/or balling. In a similar manner, the tangential forces or the torque required to rotate the bit at the bottom of the borehole in such a situation is again undesirably increased, as the cutting elements are merely moving the formation chips out of the way by sheer force, being unassisted by the relatively sharp edge 22 of cutting element 20. Stated another way, the required normal and tangential forces are both increased due to the large bearing area provided by the build-up or balling of formation material at the cutting edge of the cutting element 20. The net result is an extremely inefficient rock cutting removal mode, which in some circumstances and in certain formations may actually cause a cessation of drilling.

Figure 3:
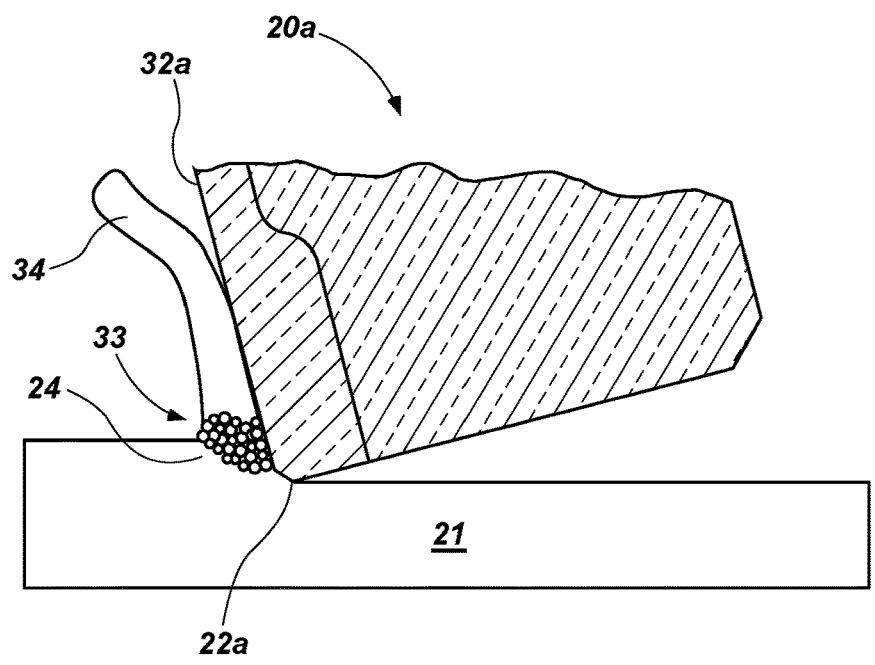
FIG. 3 illustrates a side elevation view of a cutting element having a cutting face polished to a surface roughness less than about 0.5 μin. (about 0.0127 μm) RMS as the cutting element engages and cuts a subterranean formation, depicting the manner in which formation particles compact against the cutting face to form a continuous and uniform formation chip that is cut and removed from the formation without build-up ahead of the cutting face.

As shown in FIG. 3, a cutting element 20a, similar to cutting element 20 depicted in FIG. 2, is shown engaging and cutting the same subterranean formation 21. The substantial difference between the two cutting elements is that the cutting face 32a of the cutting element 20a has been physically modified, as by polishing to a mirror finish of about 0.5 μin. (about 0.0127 μm) RMS. As illustrated, the cutting edge 22a of cutting element 20a is fully engaged with the pristine or previously uncut and undisturbed area 24 of subterranean formation 21, failure of the formation material occurring immediately adjacent the cutting edge 22a. When a cutting element 20a with a planar, polished cutting face 32a is pushed through uncut formation 24, the uncut formation 24 fractures into granular pieces 33 and may then be substantially immediately compacted into the cutting face 32a of the cutting element 20a, due to the forward movement of the cutting element 20a relative to the formation 24. In view of this, the granular pieces 33 of fractured formation that impact the cutting face 32a of the cutting element 20a may become compressed together, forming a cohesive structure 34 known generally in the art as a "chip." Cutting edge 22a of the polished cutting face 32a is able to cut or shear the chip 34 from the formation in an unimpeded manner. As shown, a formation chip 34 of substantially uniform thickness moves relatively freely from the point of contact or line of contact from cutting edge 22a of cutting face 32a upwardly along the cutting face 32 until it breaks off by contact with either the bit body 11 or a chip-breaker of the drill bit 10, or due to impact by drilling fluid emanating from a nozzle 18 on the face of the bit body 11, or fluid coursing through a channel on the face of the drill bit 10. The polished or mirror finish provided on the cutting face 32a of cutting element 20a lowers the overall stresses applied to the formation in the cutting area and permits the chip 34 to ride smoothly due to reduced sliding friction in an unimpeded manner up the cutting face 32a.

A cleanly cut formation chip 34 of substantially uniform thickness, as shown in FIG. 3, is favorable over an irregular, stuck, balled and/or built-up formation chip 28, as shown in FIG. 2. Even more desirable, however, is a cutting element that produces discrete chips of reduced size. As the size of the discrete chips is reduced, the rate by volume of cut formation material that may be removed from the wellbore is increased, enhancing the efficiency of the drill bit 10. The effectiveness of a cutting element at creating smaller chips may be further increased by the use of what is often referred to in the art as a "shaped cutting element," i.e., a cutting element having a front cutting face including at least one shaped feature, such as a recess or a protrusion on the cutting face, that may affect the degree to which formation cuttings compact into chips, and the degree to which those chips stick to the cutting face of the cutting element. Such shaped features may be formed in a flat, planar front cutting face or in a three-dimensional, non-planar front cutting face of a cutting element.

Figure 4:
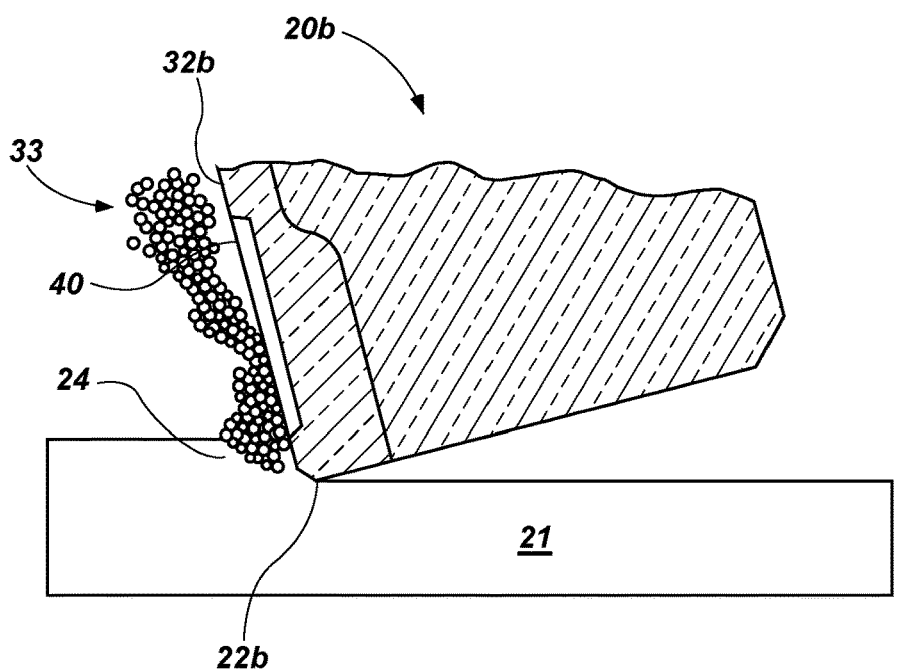
FIG. 4 illustrates a side elevation view of the cutting element of FIG. 3 having a shaped feature comprising a recessed surface in the cutting face of the cutting element, depicting the manner in which formation material is fractured into granular form, according to an embodiment of the present disclosure.

As shown in FIG. 4, when a cutting element 20b having at least one shaped feature 40 (shown in FIG. 4 as a recess) in the cutting face 32b positioned just radially inward of the cutting edge 22b at a sufficient depth is pushed through uncut formation 24, granular pieces 33 of fractured formation may be inhibited or prevented from impacting the cutting element 20b after fracturing. As a result, the granular pieces 33 of fractured formation may not compress together sufficiently to form cohesive structures of any substantial size and may be carried away with more ease by drilling fluid. If the granular pieces 33 nevertheless compress together to form a discrete chip due to impaction with the portion of the cutting face 32b between the cutting edge 22b and the shaped feature 40, the shaped feature acts as a chip breaker to fracture the chip. In particular, in such a situation, if the shaped feature 40 is in the form of a recessed surface in the cutting face 32b, as depicted in FIG. 4, a significant pressure differential will be exerted on the chip at the location of the recessed surface, causing the chip to fracture as it moves freely up the cutting face 32b and over the recessed surface. On the other hand, if the shaped feature 40 is in the form of a raised surface, or protrusion, extending outwardly from the cutting face 32b, the raised surface will act as a more traditional chip breaker. It is to be appreciated that the shaped feature 40 of the cutting face 32b may be in the form of a recess extending into the cutting face 32b, a protrusion extending outwardly from the cutting face 32b, or a combination of recesses and protrusions in the cutting face 32b.

The inventors have discovered that the beneficial effects of providing a shaped feature on a cutting face of a cutting element may be further enhanced by polishing at least portions of the cutting face and/or the shaped feature. In light of this, the work required to penetrate a formation with an earth-boring tool having cutting elements with such features may be relatively low, as work that would ordinarily be expended by cutting elements compressing fractured formation to form chips may not be required.

Figure 5:
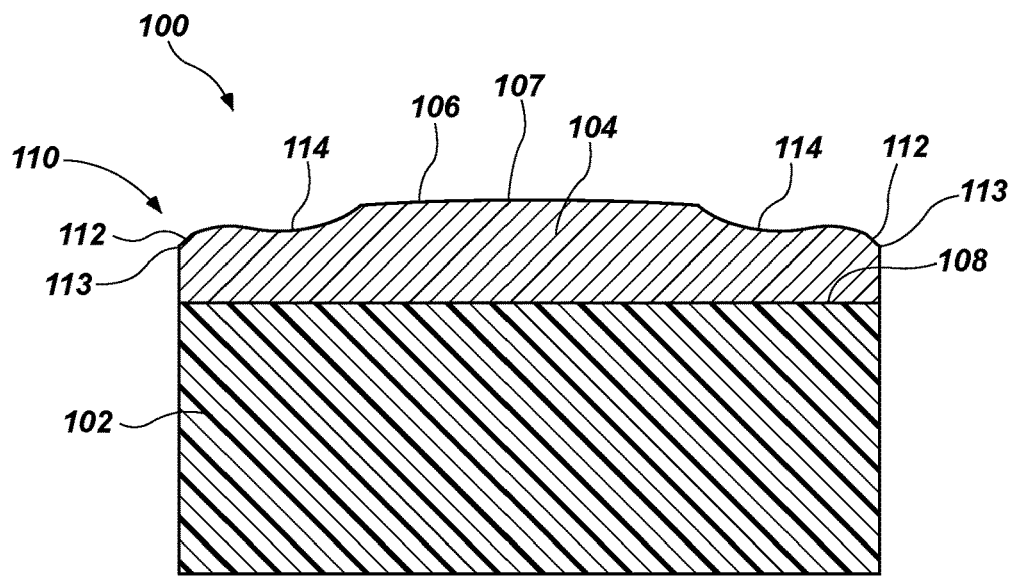
FIG. 5 illustrates a cross-sectional side view of a cutting element having a cutting face with a shaped feature, according to an embodiment of the present disclosure.
Figure 6:
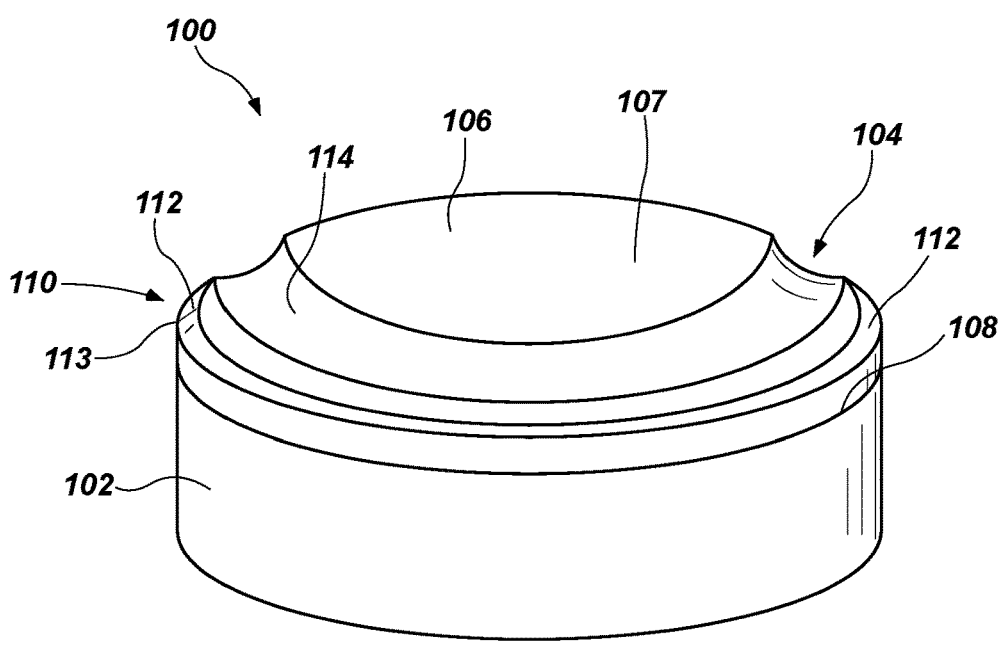
FIG. 6 illustrates a perspective view of the cutting element of FIG. 5.

FIGS. 5 and 6 illustrate a shaped cutting element 100. The shaped cutting element 100 may include a cutting element substrate 102, and a volume of superabrasive material 104 disposed on the substrate 102. The volume of superabrasive material 104 may comprise, for example, polycrystalline diamond (PCD) or polycrystalline cubic boron nitride. When the volume of superabrasive material 104 comprises diamond, the volume of superabrasive material 104 is often referred to in the art as a "diamond table." As shown in FIGS. 5 and 6, a front cutting face 106 of the volume of superabrasive material 104 is not planar, but rather has a dome shape 107. Stated another way, the profile of the front cutting face 106 has an arcuate, convex shape, as illustrated in the cross-sectional view of FIG. 5. It is to be appreciated that in other embodiments, the front cutting face 106 of the cutting element 100 may include a faceted face, a noncontiguous face, an undulating faces, or any combination of such face types.

An interface 108 may be defined between the cutting element substrate 102 and the volume of superabrasive material 104. Optionally, the volume of superabrasive material 104 may have a chamfered peripheral edge 110 with a chamfer surface 112 defining a cutting edge 113 of the cutting element 100. The cutting element substrate 102 may have a generally cylindrical shape. One or more arcuate, or "radiused" edges or edge portions may be employed in lieu of, or in addition to, the chamfer surface 112, as known to those of ordinary skill in the art.

The volume of superabrasive material 104 may be formed on the cutting element substrate 102, or the volume of superabrasive material 104 and the cutting element substrate 102 may be separately formed and subsequently attached together. The cutting element substrate 102 may be formed from a material that is relatively hard and resistant to wear. For example, the cutting element substrate 102 may be formed from and include a ceramic-metal composite material (which is often referred to as a "cermet" material), such as a cemented carbide material. As one non-limiting particular embodiment, the cutting element substrate 102 may comprise a cobalt-cemented tungsten carbide material, in which tungsten carbide particles are cemented together in a metallic binder matrix comprising cobalt or a cobalt alloy. Other metals may be used as the metallic binder matrix, such as nickel, iron, or alloys thereof.

As previously mentioned, the front cutting face 106 of the volume of superabrasive material 104 may include one or more shaped features. By way of example and not limitation, the front cutting face 106 of the volume of superabrasive material 104 may include one or more recesses and/or protrusions as disclosed herein, and as also disclosed in the aforementioned U.S. application Ser. No. 13/477,905, filed May 22, 2012, now U.S. Pat. No. 9,243,452, issued Jan. 26, 2016, in the name of DiGiovanni et al.; U.S. application Ser. No. 13/472,377, filed May 15, 2012, in the name of DiGiovanni et al.; and/or U.S. Patent Publication No. 2011/0259642 A1, published on Oct. 27, 2011, in the name of DiGiovanni et al.

Figure 7A:
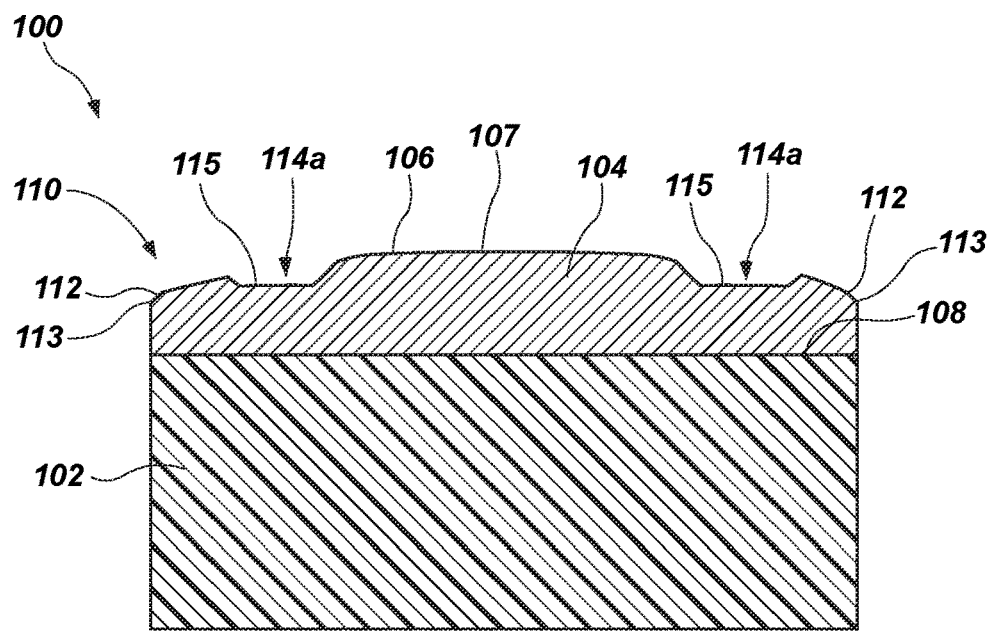
FIG. 7A illustrates a partial cross-sectional side view of a cutting element having a cutting face with a shaped feature in the form of a recess, wherein the recess has at least one surface having a linear profile taken along a cross-section parallel with the longitudinal axis of the cutting element, according to an embodiment of the present disclosure.
Figure 7B:
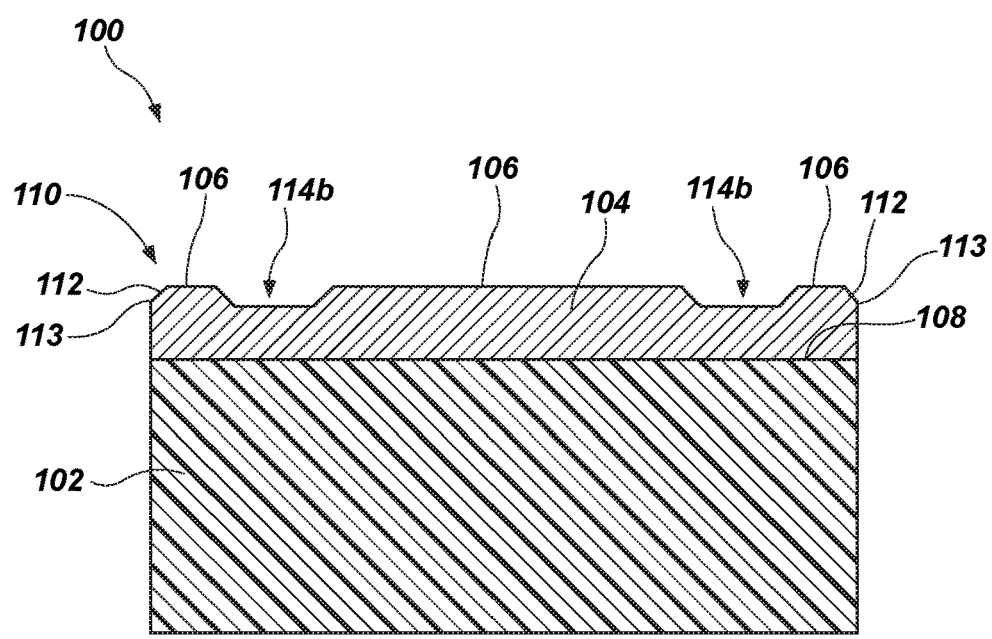
FIG. 7B illustrates a partial cross-sectional side view of a cutting element having a planar cutting face with a shaped feature in the form of an annular recess formed in the planar cutting face, according to an embodiment of the present disclosure.

As one non-limiting example, shown in FIGS. 5 and 6, a generally annular, recessed surface 114 may be defined in the cutting face 106 of the cutting element 100. The recessed surface 114 may be positioned proximate to the chamfered peripheral edge 110 of the cutting element 100, such as proximate to the chamfer surface 112. In some embodiments, the recessed surface 114 may have an arcuate profile taken along a cross-section parallel with a longitudinal axis of the cutting element 100, as shown in FIG. 5. In other embodiments, as illustrated in FIG. 7A, the cutting face 106 may have a recess 114a including at least one surface 115 having a linear profile taken along a cross-section parallel with the longitudinal axis of the cutting element. In other embodiments, the recess 114 may have any cross-sectional shape. In yet other embodiments, as shown in FIG. 7B, the cutting face 106 may be generally planar, and may have a shaped feature in the form of an annular recess 114b formed in the planar cutting face 106. In such an embodiment, the portion of the cutting face 106 adjacent the chamfer surface 112 may be co-planar with the portion of the cutting face 106 radially inward of the annular recess 114b.

With continued reference to FIGS. 5 and 6, as non-limiting examples, the recessed surface 114 may extend a depth of between about 0.001 in. (about 0.0254 mm) and about 0.1 in. (about 2.54 mm) into the volume of superabrasive material 104 from the front cutting face 106. Additionally, the recessed surface 114 may have a width of between about 0.0039 in. (about 0.1 mm) to about 0.3937 in. (about 10.0 mm), from about 0.0197 in. (about 0.5 mm) to about 0.3150 in. (about 8.0 mm), or even from about 0.0398 in. (about 1.0 mm) to about 0.1969 in. (about 5.0 mm). The radially outer edge of the recessed surface 114 may be positioned a distance of between about 0.0039 in. (about 0.1 mm) and about 0.3150 in. (about 8.0 mm) from the chamfer surface 112. The chamfered peripheral edge 110 may have a width (measured perpendicular to a central axis of the cutting element 100) of between about 0.01 in. (about 0.254 mm) and about 0.0190 in. (about 0.483 mm). In one non-limiting embodiment, the radially outer edge of the recessed surface 114 may be positioned a distance of about 0.0398 in. (about 1.0 mm) from the chamfer surface 112, and the chamfered peripheral edge 110 may have a width of about 0.01 in. (about 0.254 mm). In another non-limiting embodiment, the radially outer edge of the recessed surface 114 may be positioned a distance of about 0.0472 in. (about 1.2 mm) from the chamfer surface 112, and the chamfer edge 110 may have a width of about 0.0160 in. (about 0.406 mm). In a further non-limiting embodiment, the radially outer edge of the recessed surface 114 may be positioned a distance of about 0.0630 in. (about 1.6 mm) from the chamfer surface 112, and the chamfered peripheral edge 110 may have a width of about 0.0190 in. (about 0.483 mm).

The recessed surface 114 may extend circumferentially entirely around the cutting element 100 about a central axis of the cutting element 100, in an annular configuration. In additional embodiments, the recessed surface 114 may extend only partially around the cutting element 100 about the central axis thereof, and may include non-annular curved and/or linear segments. In some embodiments, the recessed surface 114 may include one or more sections that have a catenary shape (e.g., a shape of a hyperbolic cosine).

Cutting elements including volumes of superabrasive material having shaped features as described hereinabove, such as the cutting element 100 depicted in FIGS. 5 and 6, may be fabricated using any number of techniques, including any of the techniques disclosed in the aforementioned U.S. patent application Ser. No. 13/477,905, filed May 22, 2012, now U.S. Pat. No. 9,243,452, issued Jan. 26, 2016, in the name of DiGiovanni et al.; U.S. patent application Ser. No. 13/472,377, filed May 15, 2012 in the name of DiGiovanni et al.; and U.S. Patent Publication No. 2011/0259642 A1, published on Oct. 27, 2011 in the name DiGiovanni et al. For example, the cutting element 100 may be formed using a high temperature, high pressure (HTHP) process, as known in the art.

Recesses and/or protrusions at the cutting face, such as the annular, recessed surface 114, may be formed in situ during the HTHP sintering process. Alternatively, recesses and/or protrusions formed in the cutting face of the volume of superabrasive material may be formed after an HTHP sintering process. For example, a laser ablation process, as disclosed in U.S. Patent Publication No. 2009/0114628 A1, published May 7, 2009, in the name of DiGiovanni, the disclosure of which is incorporated herein in its entirety by this reference, may be used to remove selected, localized regions of the volume of superabrasive material, and may be used to form recesses and/or protrusions, as described herein, in or on the volume of superabrasive material. Additional, non-limiting examples of processes known in the art that may be utilized to assist in the removal of selected, localized regions of the volume of superabrasive material include an electro-discharge machining (EDM) process, a mechanical machining process, a leaching process, or any combination of the foregoing processes.

Figure 8A:
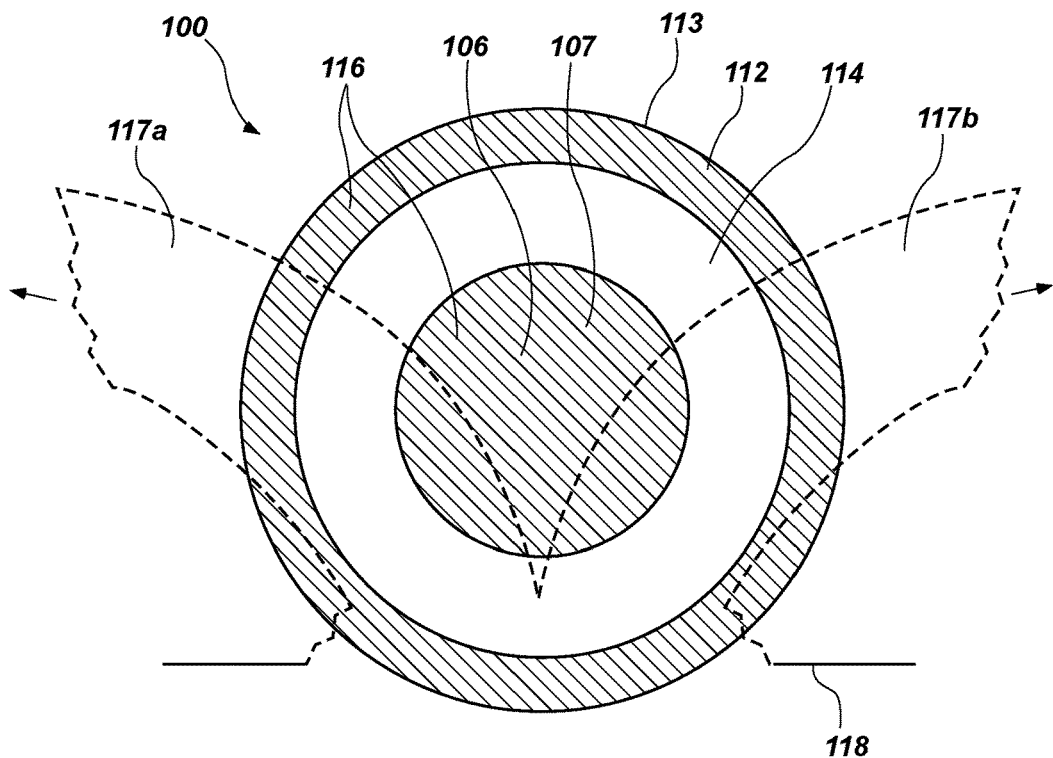
FIG. 8A illustrates a plan view of a cutting face of the cutting element of FIGS. 5 and 6, depicting the manner in which the cutting face generates two (2) discrete streams of formation cuttings when the cutting element engages a subterranean formation, according to an embodiment of the present disclosure.

Referring now to FIG. 8A, a plan view of the cutting element 100 of FIGS. 5 and 6 is illustrated. A portion 116 of the cutting face 106, represented as the shaded area of the cutting face 106, may be polished to a surface roughness of about 10 μin. (about 0.254 μm) RMS or less. As shown in FIG. 8A, the portion 116 may include portions of the cutting face 106 outside the annular, recessed surface 114. The shape of the cutting face 106, particularly the domed surface 107, diverts formation cuttings into two (2) discrete streams 117a, 117b of formation cuttings sliding across the cutting face 106 toward opposite sides thereof as the cutting element 100 engages a top surface 118 of an uncut subterranean formation. This diversion of formation cuttings into at least two (2) discrete streams generates smaller formation chips. The polished portion 116 of the cutting face 106, against which the at least two (2) discrete streams of formation cuttings move across, produces smoother, more uniform chips. The formation of smoother, more uniform chips reduces the deleterious effects of sticking, build-up and balling, as previously described.

For example, at a shallow depth-of-cut, such as when a top surface 118 of an uncut formation generally encounters the cutting face 106 between the chamfer surface 112 and the arcuate, recessed surface 114, as shown in FIG. 8A, as the cutting element 100 is pushed through the uncut formation, the uncut formation fractures into granular pieces that are forced, by the movement of the cutting element 100, generally upwardly along the cutting face 106. If the portions of the cutting face 106 radially outward from the arcuate, recessed surface 114 are polished to a surface roughness less than about 10 μin. (about 0.254 μm) RMS, the granular pieces may move more freely against the cutting face 106 between the chamfer surface 112 and the recessed surface 114. Additionally, before the granular pieces can compress together, the granular pieces may encounter the arcuate, recessed surface 114 of the cutting face 106 and may thus be prevented from compressing together to form a cohesive chip of any substantial size. If the granular pieces nevertheless compress together to form a discrete chip due to impaction with the portion of the cutting face 106 between the chamfer surface 112 and the recessed surface 114, the pressure differential asserted against the chip by the recessed surface 114 may fracture the chip as the chip moves over the recessed surface 114. If the pressure differential asserted against the chip by the recessed surface 114 does not fracture the chip, the chip may continue to move freely upwardly over the cutting face 106 toward the inner radial edge of the recessed surface 114, at which point the inner radial edge of the recessed surface 114 may act as a chip breaker to fracture the chip.

Thereafter, in embodiments where the polished portion 116 of the cutting face 106 having a surface roughness less than about 10 μin. (about 0.254 μm) RMS includes the domed surface 107, the granular pieces and any formation chips formed therefrom (being smoother in relation to formation chips produced by an unpolished cutting face 106) may move freely against the domed surface 107 without sticking thereto as the granular pieces and formation chips are diverted to either side of the cutting face 106 into two (2) discrete streams of formation cuttings 117a, 117b by the contour of the domed surface 107. At a deeper depth-of-cut (not shown), such as when the top surface 118 of the uncut formation generally encounters the cutting face 106 at the domed surface 107 (which may also occur at a shallower depth-of-cut if a wear-flat has formed in the cutting face 106), if the polished portion 116 of the cutting face 106 includes the domed surface 107, the curvature of the domed surface 107 may generally force the granular pieces, and any formation chips formed therefrom, to either side of the cutting face 106 into two (2) discrete streams of formation cuttings 117a, 117b. The generation of two (2) discrete streams of formation cuttings results in a more efficient cutting element. Additionally, deleterious effects may be reduced, such as build-up or balling of formation material in front of the cutting face 106.

In other embodiments, the annular, recessed surface 114 may also be polished to a reduced surface roughness. In additional embodiments, the chamfer 112 and/or other side surfaces of the volume of superabrasive material 104 may be polished to a reduced surface roughness. In yet further embodiments, the entire exposed cutting face 106 of the volume of superabrasive material 104 may be polished to a reduced surface roughness.

Figure 8B:
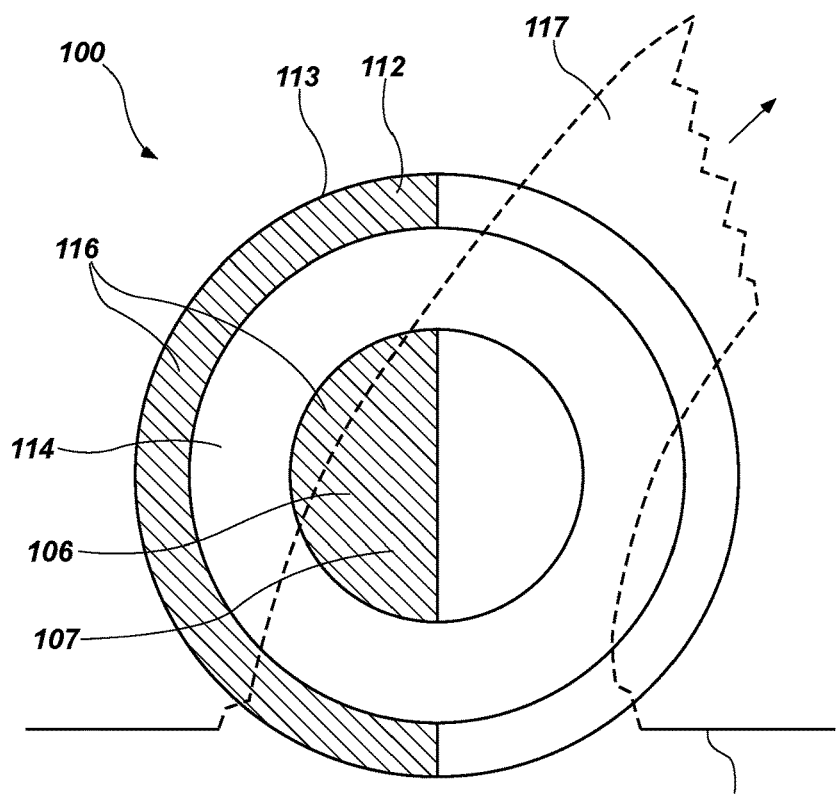
FIG. 8B illustrates a plan view of an additional embodiment of the cutting face of the cutting element of FIGS. 5 and 6, depicting a another pattern of polishing a portion of the cutting face, according to an embodiment of the present disclosure.

In yet other embodiments, as illustrated in FIG. 8B, the polished portion 116 of the cutting face 106 may generally comprise one half of the exposed surfaces of the cutting face 106 outside the recessed surface 114. In such an embodiment, a boundary between the polished 116 and unpolished portions of the exposed surfaces of the cutting face 106 outside the recessed surface 114 may extend generally from a cutting edge 113 at a point of contact with the top surface 118 of a formation material to the opposite side of the cutting face 106 through the center of the cutting face 106, as described in the aforementioned U.S. patent application Ser. No. 13/461,388, filed May 1, 2012, now U.S. Pat. No. 8,991,525, issued Mar. 31, 2015, in the name of Bilen et al. The differential in sliding friction exerted against the formation cuttings by the polished 116 and unpolished portions of the cutting face 106 will urge a single stream of formation cuttings 117 laterally away from the center of the cutting face 106 to the side of the cutting face 106 having the unpolished portion, as shown in FIG. 8B. As used herein, the phrase "laterally away from the center of the cutting face" means away from the center of the cutting face and toward a peripheral edge of the cutting face between a point of contact of the cutting face with uncut formation material and a location of the cutting face proximate a face or crown of an earth-boring tool to which the cutting element is attached during use in an earth-boring operation. It is to be appreciated that any pattern of polished surfaces of the cutting face 106 is within the scope of the present disclosure.

To provide the portions 116 of the cutting face 106 having a reduced surface roughness, one or more of the exposed surfaces of the cutting face 106 of the volume of superabrasive material 104 may be physically modified, such as by polishing to a smooth or mirrored finish. For example, an outer surface of the volume of superabrasive material 104 may have a reduced surface roughness, such as described in the aforementioned U.S. patent application Ser. No. 13/461,388, filed May 1, 2012, now U.S. Pat. No. 8,991,525, issued Mar. 31, 2015, in the name of Bilen et al.; and U.S. Patent Publication No. 2009/0114628 A1, published May 7, 2009, in the name of DiGiovanni; and as also described in U.S. Pat. No. 6,145,608, issued on Nov. 14, 2000, to Lund et al.; U.S. Pat. No. 5,653,300, issued Aug. 5, 1997, to Lund et al.; and U.S. Pat. No. 5,447,208, issued Sep. 5, 1995, to Lund et al., the disclosure of each of which is incorporated herein it its entirety by this reference. As a non-limiting example, at least a portion of the front cutting face 106 of the volume of superabrasive material 104 may be polished to a surface roughness of about 10 μin. (about 0.254 μm) RMS or less.

In conventional PDC cutting elements, a cutting face or leading face of the cutting element might be lapped to a surface roughness of 20 μin. (about 0.508 μm) to 40 μin. (about 1.02 μm) RMS, which is relatively smooth to the touch and visually planar (if the cutting face is itself flat), but which includes a number of surface anomalies and exhibits a degree of roughness which is readily visible to one even under very low power magnification, such as a 10× jeweler's loupe. However, an exterior surface of the volume of superabrasive material 104 may be treated to have a greatly reduced surface roughness. As a non-limiting example, an exterior surface of the volume of superabrasive material 104 may be polished to a surface roughness of about 10 μin. (about 0.254 μm) RMS.

In some embodiments, the surface roughness of a surface of the volume of superabrasive material 104 may be reduced by lapping of the cutting face 106 on conventional cast iron laps known in the art by using progressively smaller diamond grit suspended in a glycol, glycerine or other suitable carrier liquid. The lapping may be conducted as a three-step process commencing with a 70 micron grit, progressing to a 40 micron grit and then to a grit of about 1 to 3 microns in size. In contrast, standard lapping techniques for a PDC cutting element, which may follow an initial electrodischarge grinding of the cutting face, finish lapping in one step with 70 micron grit. By way of comparison of grit size, 70 micron grit is of the consistency of fine sand or crystalline material, while 1 to 3 micron grit is similar in consistency to powdered sugar.

In additional embodiments, the surface roughness of a surface of the volume of superabrasive material 104 may be reduced by placing the surface in contact with a dry, rotating diamond wheel. For example, the Winter RB778 resin bonded diamond wheel, offered by Ernst Winter & Sons, Inc. of Travelers Rest, S.C., may be utilized. It may be important that the wheel be cooled as the diamond wheel is of resin bonded construction. Elevated temperatures may result in the destruction of the wheel. The nature of the polishing process may require that the abrasive surface be kept dry. However, the wheel may be moistened with water at the start of the polishing process to reduce drag and facilitate proper orientation of the volume of superabrasive material 104 against the wheel. In addition, a temperature range wherein polishing may be effected may be between about 140° F. (about 60° C.) and about 220° F. (about 104° C.). While specific polishers employed may rotate at about 3500 RPM, it is believed that a range between about 3000 RPM and about 5000 RPM would likely be adequate. About 2 lb. force (about 0.9 Kg) to about 8 lb. force (about 3.6 Kg) may be applied to the volume of superabrasive material 104 against the wheel. As noted, the finish of an exterior surface of the volume of superabrasive material 104 may be smoothed to about 0.5 µin. (about 0.0127 µm) RMS or less surface roughness approaching a true "mirror" finish. It may take about fifty minutes to about an hour of polishing with the aforementioned diamond wheel to achieve this finish on a surface of a one-half inch (about 1.27 cm) diameter volume of superabrasive material 104, and about one and one-half to about two hours for a nominal three-quarter inch (about 1.905 cm) diameter volume of superabrasive material 104. This same method described for polishing a face of the volume of superabrasive material 104 may also be applied to polish the chamfer 112, the domed surface 107, and the lateral side surface of the volume of superabrasive material 104. To polish such surfaces, the volume of superabrasive material 104, held by the substrate 102, is disposed at the desired angle to the rotating wheel. The cutting element 100 may then be rotated about an axis of symmetry to smooth and polish the chamfer 112 or other side areas of the volume of superabrasive material 104. Thus, one could smooth and polish a curved, ridged, waved or other raised, shaped feature, such as the domed surface 107, of the cutting face 106 of a volume of superabrasive material 104 to remove and reduce both large and small asperities, resulting in a mirror finish cutting face, which nonetheless is not flat in the absolute sense.

The portions 116 of the cutting element 100 (cutting face 106, domed surface 107, annular, recessed surface 114, chamfer surface 112, lateral side surfaces, etc.) may be polished by other methods, such as ion beams or chemicals, although the inherently inert chemical nature of diamond may make the latter approach somewhat difficult for diamond. In other embodiments, exposed surfaces of the volume of superabrasive material 104, including portions 116 of the cutting face 16, may be polished by a laser polishing process, as described in the aforementioned United States Patent Publication No. 2009/0114628 A1, published May 7, 2009, to DiGiovanni.

In other embodiments, one or more of the portions 116 of the cutting face 106 of the volume of superabrasive material 104 may be physically modified, such as by applying a conformal volume, or "coating," of diamond-like carbon (DLC) having a surface roughness less than about 10 µin. (about 0.254 µm) RMS thereto. In such embodiments, the polished portions 116 of the cutting face 106, as shown in FIGS. 8A and 8B, may represent a conformal volume of DLC material disposed over the volume of superabrasive material 104. The conformal volume of DLC material may be applied to the volume of superabrasive material 104 according to any of the methods described in U.S. Patent Publication No. 2009/0321146 A1, published Dec. 31, 2009, in the name of Dick et al.; and U.S. Patent Publication No. 2012/0205162 A1, published Aug. 16, 2012, in the name of Patel et al., the disclosure of each of which is incorporated herein in its entirety by this reference. For example, the conformal volume of DLC material may be disposed over the volume of superabrasive material 104 by one or more of a chemical vapor deposition (CVD) process, a plasma assisted chemical vapor deposition (PACVD) process, an ion beam deposition process, a cathodic arc spray process, a pulsed laser ablation process, and an argon ion sputtering process. In yet additional embodiments, one or more portions 116 of the cutting face 106 of the volume of superabrasive material 104 may be physically modified, such as by applying, or "growing," a conformal volume, or "coating," of synthetic diamond on the volume of superabrasive material 104 by a chemical vapor deposition (CVD) process.

Synthetic diamond applied in such a manner may be referred to as "CVD diamond." A conformal volume of DLC material or CVD diamond may have a thickness in the range of about 197 µin. (about 5 µm) to about 0.0031 in. (about 80 µm). In other embodiments, the conformal volume of DLC material may have a thickness in the range of about 40 µin. (about 1.0 µm) to about 0.004 in. (about 102 µm).

While an industry-standard PDC or other superhard cutting element may have a lapped surface finish on the cutting face with irregularities or roughness (measured vertically from the surface) on the order of 20 µin. (about 0.508 µm) to 40 µin. (about 1.02 µm) RMS, as a result of the above-described polishing, some embodiments may have portions of a volume of superabrasive material 104 surface roughness between about 0.3 µin. (about 0.0076 µm) RMS and about 0.5 µin. (about 0.0127 µm) RMS. Additional embodiments may have portions of a volume of superabrasive material 104 with a surface roughness between about 0.4 µin. (about 0.0102 µm) RMS and about 0.6 µin. (about 0.0152 µm) RMS. In yet additional embodiments, portions of the volume of superabrasive material 104 may have a surface roughness less than about 10 µin. (about 0.254 µm) RMS. In further embodiments, portions of the volume of superabrasive material 104 may have a surface roughness less than about 2 µin. (about 0.0508 µm) RMS. In yet further embodiments, portions of the volume of superabrasive material 104 may have a surface roughness less than about 0.5 µin. (about 0.0127 µm) RMS, approaching a true "mirror" finish. In yet further additional embodiments, portions of the volume of superabrasive material 104 may have a surface roughness less than about 0.1 µin. (about 0.00254 µm). The foregoing surface roughness measurements of the volume of superabrasive material 104 may be measured using a calibrated HOMMEL® America Model T-4000 diamond stylus profilometer contacting the surface of the volume of superabrasive material 104.

It is to be appreciated that the portions 116 of the volume of superabrasive material 104 may be physically modified to have a surface roughness less than about 10 µin. (about 0.254 µm) RMS using a lapping process, a dry, rotating diamond wheel process, a laser polishing process, an ion beam or chemical polishing process, a DLC coating process, any combination of the foregoing processes, or any other process or combination of processes.

Figure 9:
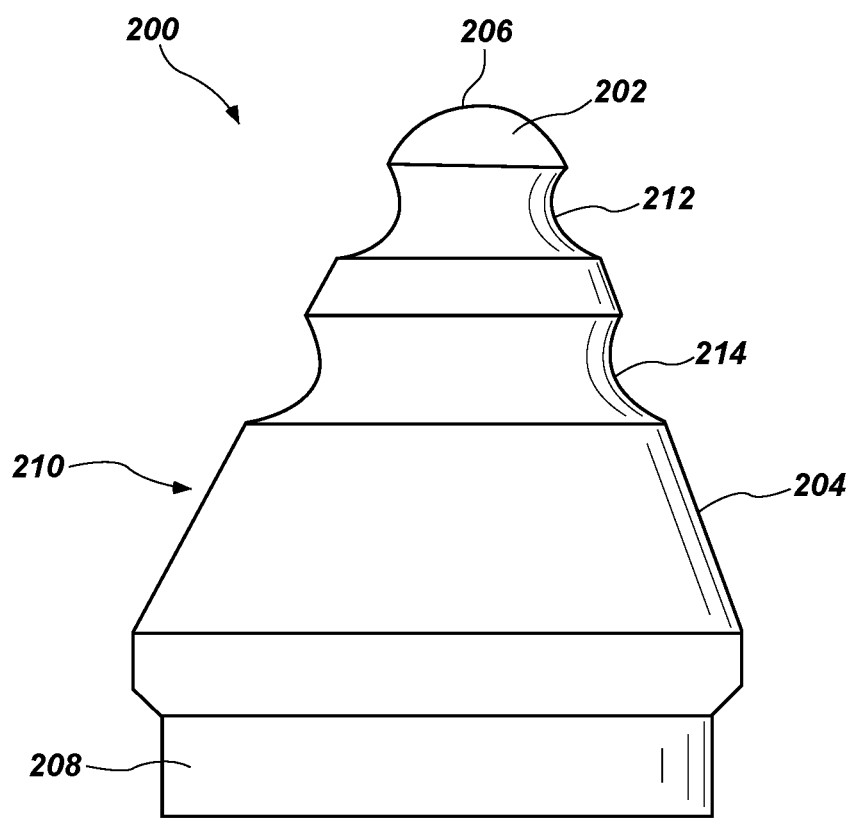
FIG. 9 illustrates a side view of a cutting element having a cutting face with a shaped feature, the shaped feature including a plurality of arcuate, annular recesses extending into a volume of superabrasive material from a non-planar cutting face, according to an embodiment of the present disclosure.

FIG. 9 illustrates another embodiment of a shaped cutting element 200 having a non-planar cutting face 202 with shaped features. The cutting face 202 of the cutting element 200 of FIG. 9 has a more pointed configuration relative to that of FIGS. 5 and 6, and includes a generally conical lateral side surface 204 extending to a generally domed end surface 206. The cutting element 200 also may include a cutting element substrate 208, and a volume of superabrasive material 210 on the substrate 208. The volume of superabrasive material 210 and the substrate 208 may be as previously described in relation to the volume of superabrasive material 104 and the substrate 102 of FIGS. 5 and 6. The volume of superabrasive material 210 may be sized and configured such that the cutting face 202, which comprises the generally conical lateral side surface 204 and the generally domed end surface 206, comprises exposed surfaces of the volume of superabrasive material 210.

The cutting face 202 of the cutting element 200 also includes one or more shaped features. By way of example and not limitation, the shaped features of the cutting face 202 of the volume of superabrasive material 210 may include one or more recesses as disclosed in the aforementioned U.S. patent application Ser. No. 13/477,905, filed May 22, 2012, now U.S. Pat. No. 9,243,452, issued Jan. 26, 2016, in the name of DiGiovanni et al.; U.S. patent application Ser. No. 13/472,377, filed May 15, 2012 in the name of DiGiovanni et al.; and/or U.S. Patent Publication No. 2011/0259642 A1, published on Oct. 27, 2011, to DiGiovanni et al. In other embodiments, the cutting face 202 of the volume of superabrasive material 210 may include one or more recesses or protrusions as described elsewhere in the present application.

As one non-limiting example, a first recessed surface 212 and a second recessed surface 214 may be defined in the conical side surface 204 of the volume of abrasive material 210, as shown in FIG. 9. Each of the first and second recessed surfaces 212, 214 may be similar to the previously described recessed surface 114 of FIGS. 5 and 6, and may be arcuate and concave, as shown in FIG. 9. In additional embodiments, the recessed surfaces 212, 214 may have any cross-sectional shape. The recessed surfaces 212, 214 may extend circumferentially entirely around the cutting element 200 about a central axis of the cutting element 200, in an annular configuration. In additional embodiments, the recessed surfaces 212, 214 may extend only partially around the cutting element 200 about the central axis thereof, and may include curved and/or linear segments.

Figure 10:
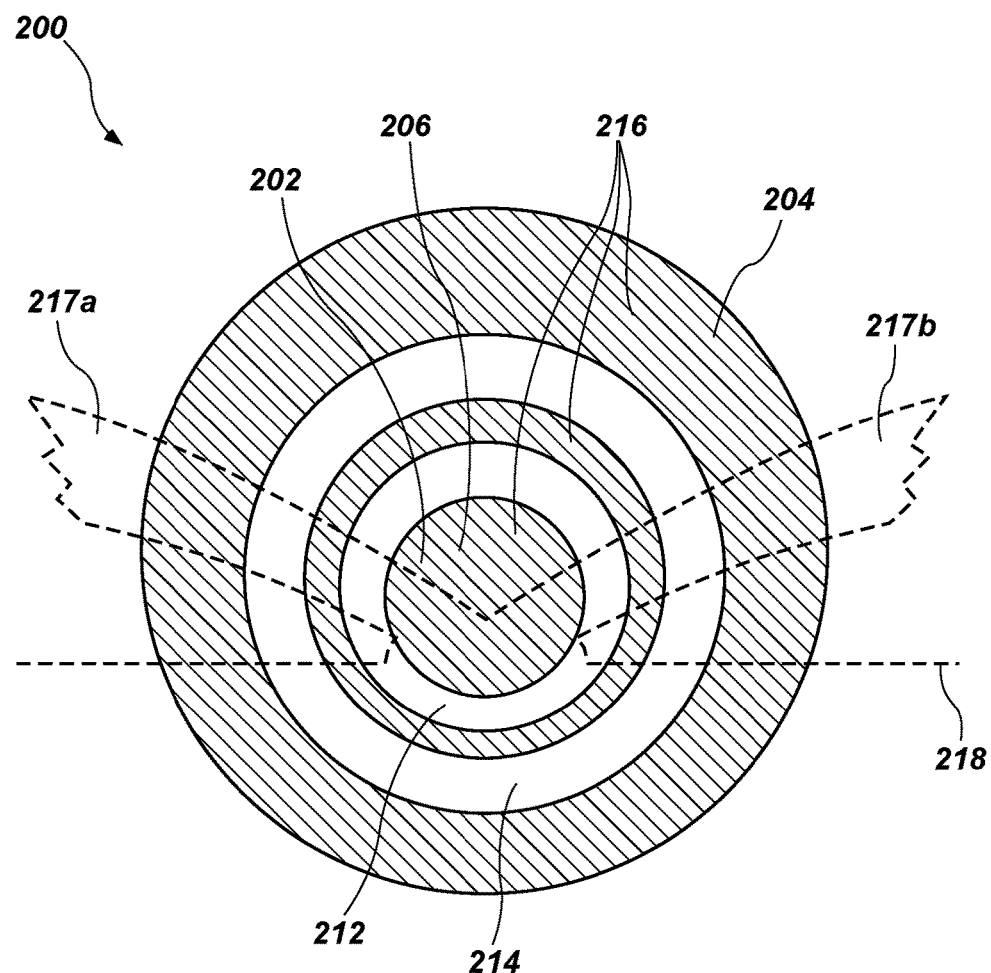
FIG. 10 illustrates a plan view of the cutting face of the cutting element of FIG. 9, depicting the manner in which the cutting face generates two (2) discrete streams of formation cuttings when the cutting element engages a subterranean formation, according to an embodiment of the present disclosure.

Portions of the volume of superabrasive material 210 of the cutting element 200 illustrated in FIG. 9 may be polished or otherwise smoothed to have a reduced surface roughness according to one or more of the methods and/or processes previously described in reference to FIGS. 5 and 6, including a lapping process, a dry, rotating diamond wheel process, a laser polishing process, an ion beam or chemical polishing process, or any combination thereof. In some embodiments, at least a portion of the generally conical lateral side surface 204 and the domed end surface 206 of the cutting face 202 may be polished to a reduced surface roughness, as previously described. For example, as shown in FIG. 10, a portion 216 of the cutting face 202, represented as the shaded area of the cutting face 202, including the generally conical lateral side surface 204 and the generally domed end 206, may be polished to a surface roughness of about 10 μin. (about 0.254 μm) RMS to facilitate the formation of smoother formation chips as the cutting face 202 engages a top surface 218 of uncut formation material, similar to the manner described with reference to the cutting element 100 of FIG. 8A. Additionally, the contour of the cutting face 202, including the generally domed end surface 206, may facilitate the diversion of the flow of cuttings against the cutting face 202 into two (2) discrete streams 217a, 217b of formation cuttings sliding off opposite sides of the cutting face 202, as previously described.

In other embodiments, at least a portion of one or both of the recessed surfaces 212, 214 may be polished to a reduced surface roughness, as previously described. In still further embodiments, the entire cutting face 202 of the volume of superabrasive material 210 may be polished to a reduced surface roughness, as previously described. In additional embodiments, at least a portion of other side surfaces of the volume of superabrasive material 210 may be polished to a reduced surface roughness, as previously described.

Figure 11:
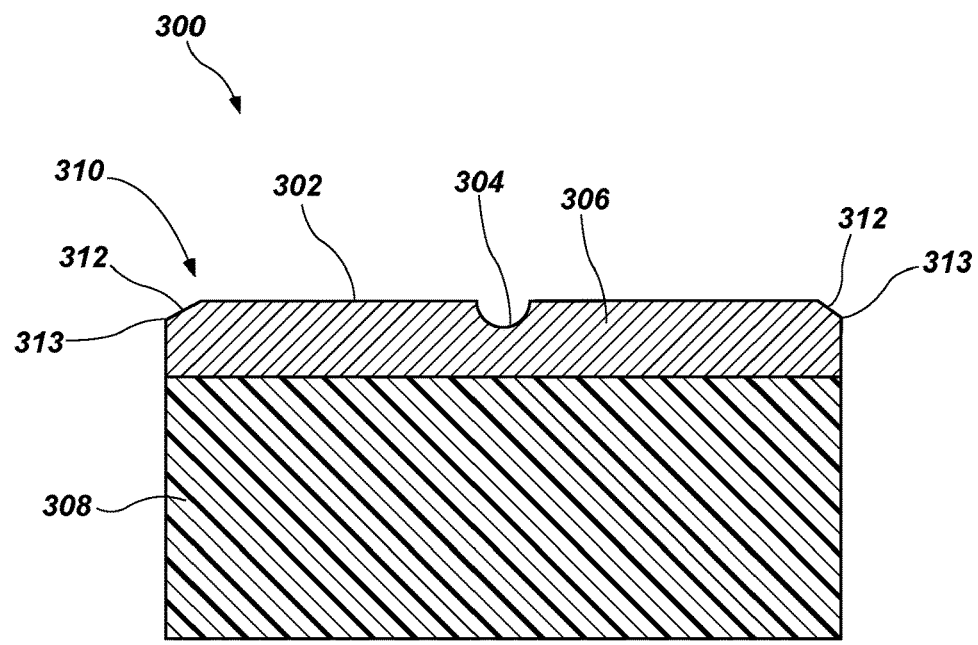
FIG. 11 illustrates a cross-sectional side view of a cutting element having a planar cutting face with a shaped feature, wherein the shaped feature is a recess extending into a volume of superabrasive material from the cutting face, according to an embodiment of the present disclosure.

FIG. 11 illustrates an embodiment of a cutting element 300 having a planar cutting face 302 with a shaped feature in the form of a linearly-extending, arcuate recessed surface 304 extending into a volume of superabrasive material 306. The recessed surface 304 may extend across an entire lateral extent of the cutting face 302, or, in other embodiments, may span a portion of the cutting face 302. As shown, the recessed surface 304 may extend through the center of the cutting face 302, or, in other embodiments, may be offset from the center of the cutting face. The cutting element 300 also may include a cutting element substrate 308 underlying the volume of superabrasive material 306. The volume of superabrasive material 306 and the substrate 308 may be as previously described in relation to the volume of superabrasive material 104 and the substrate 102 of FIGS. 5 and 6. Optionally, the volume of superabrasive material 306 may have a chamfered peripheral edge 310 with a chamfer surface 312 defining a cutting edge 313 of the cutting element 300, as previously described.

Figure 12:
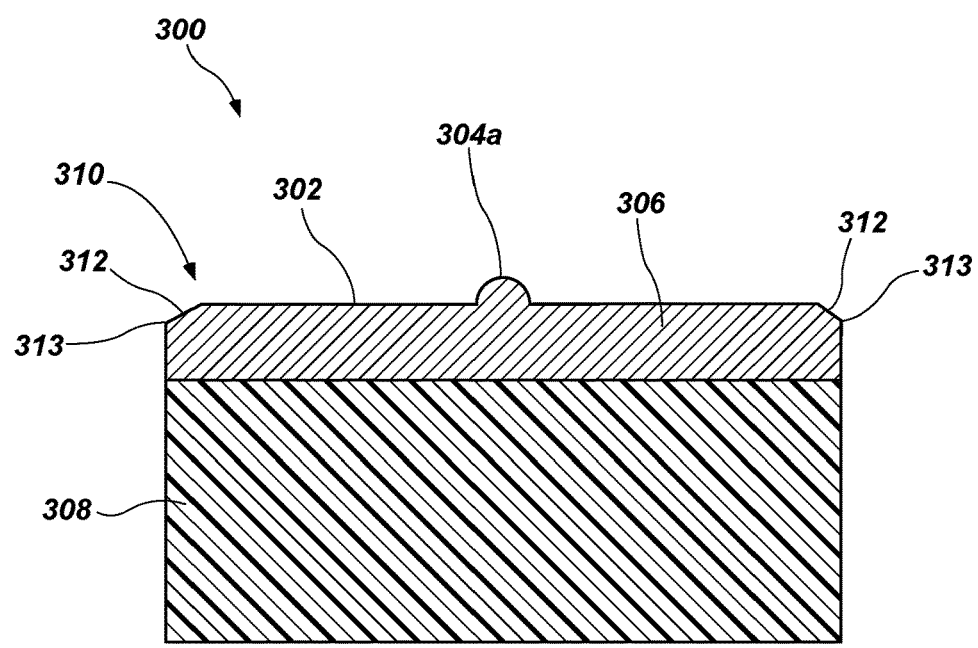
FIG. 12 illustrates a cross-sectional side view of a cutting element having a planar cutting face with a shaped feature, wherein the shaped feature is a protrusion extending outwardly from a volume of superabrasive material, according to an embodiment of the present disclosure.

In the embodiments of cutting elements described with reference to FIGS. 5 through 11, the cutting faces on the volumes of superabrasive material include recesses that extend into the volumes of superabrasive material from a major surface of the volumes of superabrasive material. In additional embodiments of the present disclosure, cutting elements may include a front cutting face on a volume of superabrasive material having one or more protrusions that extend outward from the cutting face. For example, additional embodiments of the present disclosure include cutting elements like those of FIGS. 5 through 11, wherein the cutting elements include shaped features comprising protrusions instead of recessed surfaces. In such embodiments, the protrusions may have cross-sectional geometries defined by mirror images of the previously-described recesses reflected across the surfaces defined by the front cutting faces of the volumes of superabrasive material. For example, FIG. 12 illustrates a cutting element 300 similar as shown in FIG. 11, wherein the shaped portion of the cutting face 302 may be in the form of a linearly-extending, arcuate protrusion 304a extending outwardly from the volume of superabrasive material 306. The protrusion 304a may be defined as a mirror image of the recessed surface 304 illustrated in FIG. 11 reflected across the cutting face 302 of the cutting element 300.

Figure 13:
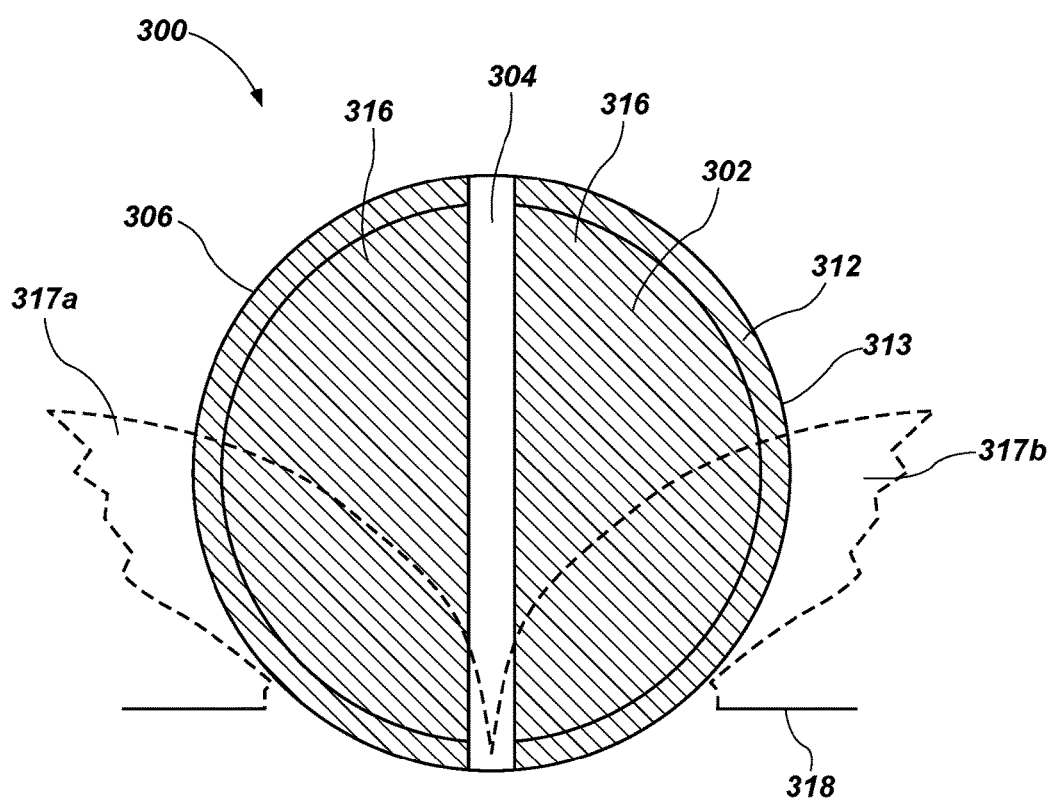
FIG. 13 illustrates a plan view of the cutting face of the cutting element of FIG. 12, depicting the manner in which the cutting face generates two (2) discrete streams of formation cuttings when the cutting element engages a subterranean formation, according to an embodiment of the present disclosure.

Referring now to FIG. 13, portions of the volume of superabrasive material 306 of the cutting element 300 illustrated in FIG. 11 may be polished or otherwise smoothed to have a reduced surface roughness according to one or more of the methods and/or processes previously described in reference to FIGS. 5 and 6, including a lapping process, a dry, rotating diamond wheel process, a laser polishing process, an ion beam or chemical polishing process, or any combination thereof. In some embodiments, at least a portion of the planar cutting face 302 may be polished to a reduced surface roughness, as previously described. In further embodiments, at least a portion of the chamfer surface 312 may be polished to a reduced surface roughness, as previously described. For example, as shown in FIG. 13, a portion 316 of the cutting face 302, represented as the shaded area of the cutting face 302, including the chamfer surface 312, may be polished to a surface roughness of about 10 μin. (about 0.254 μm) RMS to facilitate the formation of smoother chips as the cutting face 302 engages a top surface 318 of uncut formation material, similar to the manner described with reference to the cutting element 100 of FIG. 8A. Additionally, the recessed surface 304 may facilitate in the diversion of the flow of cuttings against the cutting face 302 into two (2) discrete streams 317a, 317b. In other embodiments, the recessed surface 304 may be polished to a reduced surface roughness, as previously described.

In embodiments, such as illustrated in FIG. 12, where the shaped feature of the cutting face 302 is in the form of a linearly-extending, arcuate protrusion 304a extending outwardly from the volume of superabrasive material 306, the polished portion of the cutting face 302 may include the planar surfaces of the cutting face 302, and may also include the chamfer surface 312. In other embodiments, the protrusion 304a may also be polished to a reduced surface roughness, as previously described. In additional embodiments, at least a portion of other side surfaces of the volume of superabrasive material 306 may be polished to a reduced surface roughness, as previously described.

It is to be appreciated that any of the cutting elements depicted in FIGS. 5 through 13 may be affixed to a body of an earth-boring tool to allow such tool to generate at least two (2) discrete streams of formation cuttings each containing smaller, more numerous cuttings. For example, cutting elements according to any of the embodiments disclosed herein may be affixed to the bit body 11 of the rotary drill bit 10 illustrated in FIG. 1. Additionally, cutting elements according to any of the embodiments disclosed herein may be selectively affixed to a blade 12 of the bit body 11 at one or more of a cone region, a nose region, a shoulder region, and gage region of the blade, as such regions are known in the art. In yet other additional embodiments, cutting elements according to any of the embodiments disclosed herein may be selectively affixed to other earth-boring tools located up-hole from a pilot drill bit.

In yet additional embodiments of the present disclosure, cutting elements with cutting faces having shaped features may include cutting elements having non-circular shapes when viewed along a longitudinal axis of the cutting elements. Examples of such embodiments are described in U.S. patent application Ser. No. 13/477,905, filed May 22, 2012, in the name of DiGiovanni et al., the entire disclosure of which has been incorporated herein by reference.

The recessed surface 114 of FIGS. 5 through 6C and the recessed surfaces 212 and 214 of FIG. 9 are curved or annular in shape. Other cutting elements according to the embodiments disclosed herein may include a recessed surface having linear segments, as described in the aforementioned U.S. patent application Ser. No. 13/477,905, filed May 22, 2012, now U.S. Pat. No. 9,243,452, issued Jan. 26, 2016, in the name of DiGiovanni et al.

Embodiments of cutting elements of the present disclosure may be used to attain one or more of the advantages described above. Additional non-limiting example embodiments of the present disclosure are set forth below.

Embodiment 1

A cutting element for an earth-boring tool, comprising: a substrate; and a volume of superabrasive material disposed on the substrate, the volume of superabrasive material having a cutting face having a shaped feature, the shaped feature comprising at least one of a recess extending into the volume of superabrasive material from the cutting face and a protrusion extending outward from the cutting face, a first portion of the cutting face having a first surface roughness, and a second portion of the cutting face having a second surface roughness greater than the first surface roughness of the first portion of the cutting face.

Embodiment 2

The cutting element of Embodiment 1, wherein the cutting face of the volume of superabrasive material is configured to generate at least two discrete streams of formation cuttings when the cutting element is mounted to an earth-boring tool and used to cut a subterranean formation.

Embodiment 3

The cutting element of Embodiment 2, wherein the cutting face of the volume of superabrasive material is further configured such that each of the at least two discrete streams of formation cuttings contacts the first portion of the cutting face, and the first surface roughness of the first portion is less than about 10 µin. (about 0.254 µm) RMS.

Embodiment 4

The cutting element of any one of Embodiments 1 through 3, wherein a portion of the cutting face separate from the shaped feature is one of planar and non-planar.

Embodiment 5

The cutting element of any one of Embodiments 1 through 4, wherein the shaped feature of the cutting face comprises a recess extending into the volume of superabrasive material from the cutting face, the first portion comprises at least a portion of the cutting face outside the recess, and the second portion comprises at least a portion of the cutting face inside the recess.

Embodiment 6

The cutting element of any one of Embodiments 1, 4 and 5, wherein the cutting face of the volume of superabrasive material is configured to generate one of a single stream of formation cuttings moving laterally away from the center of the cutting face, a single stream of formation cuttings curling into the direction of travel of the cutting element, and a single stream of formation cuttings curling substantially into the direction of travel of the cutting element and moving substantially laterally away from the center of the cutting face.

Embodiment 7

The cutting element of any one of Embodiments 1 through 6, wherein the first portion comprises at least a portion of the cutting face separate from the shaped feature, the second portion comprises a portion of the cutting face separate from the shaped feature and a portion of the shaped feature, and the first portion and the second portion together forming a pattern configured to direct at least one stream of formation cuttings substantially laterally away from the center of the cutting face.

Embodiment 8

An earth-boring tool, comprising: at least one cutting element affixed to a tool body, the at least one cutting element comprising: a substrate; and a volume of superabrasive material disposed on the substrate, the volume of superabrasive material having a cutting face configured to generate at least two discrete streams of formation cuttings when the at least one cutting element is used to cut a subterranean formation, the cutting face having a first portion having a first surface roughness and a second portion having a second surface roughness greater than the first surface roughness, wherein the cutting face is further configured such that each of the at least two discrete streams of formation cuttings will slide at least partially across the first portion of the cutting face when the at least one cutting element and the earth-boring tool are used to cut a subterranean formation.

Embodiment 9

The earth-boring tool of Embodiment 8, wherein the first surface roughness of the first portion is less than about 10 μin. (about 0.254 μm) RMS.

Embodiment 10

The earth-boring tool of Embodiment 8 or Embodiment 9, wherein the cutting face includes a shaped feature, the shaped feature comprising at least one of one or more recesses extending into the volume of superabrasive material from the cutting face and one or more protrusions extending outward from the cutting face.

Embodiment 11

The earth-boring tool of Embodiment 10, wherein the shaped feature of the cutting face comprises a recess extending into the volume of superabrasive material from the cutting face, the first portion comprises at least a portion of the cutting face outside the recess, and the second portion comprises at least a portion of the cutting face inside the recess.

Embodiment 12

The earth-boring tool of Embodiment 11, wherein the recess comprises at least one surface having one or more of a linear profile and an arcuate profile taken along a cross-section parallel with the longitudinal axis of the cutting element.

Embodiment 13

The earth-boring tool of any one of Embodiments 10 through 12, wherein the shaped feature of the cutting face comprises a plurality of recesses extending into the volume of superabrasive material from the cutting face, the first portion includes at least a portion of the cutting face outside the plurality of recesses, and the second portion includes a portion of the cutting face inside the plurality of recesses.

Embodiment 14

The earth-boring tool of any one of Embodiments 10 through 13, wherein the shaped feature of the cutting face comprises a protrusion extending outward from the cutting face, and the second portion includes at least a portion of a surface of the protrusion.

Embodiment 15

The earth-boring tool of Embodiment 14, wherein the first portion includes substantially an entire exposed surface of the cutting face separate from the protrusion.

Embodiment 16

The earth-boring tool of any one of Embodiments 8 through 15, wherein the first portion of the cutting face comprises a conformal volume of at least one of diamond-like carbon (DLC) material and CVD diamond disposed over the volume of superabrasive material.

Embodiment 17

A method of forming a cutting element for an earth-boring tool, comprising: forming a volume of superabrasive material having a cutting face comprising a shaped feature, the shaped feature comprising at least one of a recess extending into the volume of superabrasive material from the cutting face and a protrusion extending outward from the cutting face; providing a first portion of the cutting face with a first surface roughness; and providing a second portion of the cutting face with a second surface roughness greater than the first surface roughness.

Embodiment 18

The method of Embodiment 17, wherein forming the volume of superabrasive material further comprises configuring the cutting face to generate at least two discrete streams of formation cuttings when the cutting element is mounted to an earth-boring tool and used to cut a subterranean formation.

Embodiment 19

The method of Embodiment 18, wherein forming the volume of superabrasive material further comprises configuring the cutting face such that each of the at least two discrete streams of formation cuttings slides at least partially over the first portion of the cutting face, and wherein providing the first portion of the cutting face with a first surface roughness further comprises providing the first portion of the cutting face with a first surface roughness less than about 10 μin. (about 0.254 μm) RMS.

Embodiment 20

The method of Embodiment 19, wherein providing the first portion of the cutting face with a first surface roughness less than about 10 μin. (about 0.254 μm) RMS comprises polishing the first portion of the cutting face to a first surface roughness less than about 10 μin. (about 0.254 μm) RMS.

Embodiment 21

The method of Embodiment 19 or Embodiment 20, wherein providing the first portion of the cutting face with a first surface roughness less than about 10 μin. (about 0.254 μm) RMS comprises disposing a conformal volume of at least one of diamond-like carbon (DLC) material and CVD diamond having a surface roughness less than about 10 μin. (about 0.254 μm) RMS over the volume of superabrasive material.

Although the foregoing description and example embodiments contain many specifics, these are not to be construed as limiting the scope of the present disclosure, but merely as providing certain example embodiments. Similarly, other embodiments of the disclosure may be devised which are within the scope of the present disclosure. For example, features described herein with reference to one embodiment may also be combined with features of other embodiments described herein. The scope of the disclosure is, therefore, indicated and limited only by the appended claims, rather than by the foregoing description. All additions, deletions, and modifications to the devices, apparatuses, systems and methods, as disclosed herein, which fall within the meaning and scope of the claims, are encompassed by the present disclosure.

What is claimed is:
1. A cutting element for an earth-boring tool, comprising:
a substrate; and a volume of superabrasive material disposed on the substrate, the volume of superabrasive material having a domed surface extending outward therefrom, a conical lateral side surface extending between the substrate and the domed surface, and at least one recess extending into the conical lateral side surface, a first portion of the volume of superabrasive material having a first surface roughness, and a second portion of the volume of superabrasive material having a second surface roughness greater than the first surface roughness of the first portion of the volume of superabrasive material;

wherein the first portion of the volume of superabrasive material comprises the domed surface and is configured to generate at least two discrete streams of formation cuttings when the cutting element is mounted to an earth-boring tool and used to cut a subterranean formation.

2. The cutting element of claim 1, wherein the first surface roughness of the first portion is less than about 10 µin (about 0.254 µm) root mean square (RMS).

3. The cutting element of claim 2, wherein the first surface roughness of the first portion is less than about 2 µin (about 0.0508 µm) RMS.

4. The cutting element of claim 3, wherein the first surface roughness of the first portion is less than about 0.5 µin (about 0.0127 µm) RMS.

5. The cutting element of claim 1, further comprising a volume of diamond-like carbon having a surface roughness less than about 10 µin (about 0.254 µm) RMS over the volume of superabrasive material.

6. The cutting element of claim 5, wherein the volume of diamond-like carbon has a thickness in a range extending from about 197 µin. (about 5 µm) to about 0.0031 in (about 80 µm).

7. The cutting element of claim 1, wherein the conical lateral side surface comprises two recesses.

8. The cutting element of claim 7, wherein the first portion of the volume of superabrasive material further comprises the conical lateral side surface.

9. An earth-boring tool, comprising:
at least one cutting element affixed to a tool body, the at least one cutting element comprising:
a substrate; and
a volume of superabrasive material disposed on the substrate, the volume of superabrasive material having a cutting face comprising a domed surface extending outward from the cutting face and at least one recess extending into the cutting face and encircling the domed surface, the at least one recess having a planar surface extending perpendicular to a longitudinal axis of the at least one cutting element, a first portion of the cutting face having a first surface roughness, and a second portion of the cutting face having a second surface roughness greater than the first surface roughness of the first portion of the cutting face;
wherein the first portion of the cutting face comprises the domed surface and is configured to generate at least two discrete streams of formation cuttings when the at least one cutting element is mounted to an earth-boring tool and used to cut a subterranean formation.

10. The earth-boring tool of claim 9, wherein the first surface roughness of the first portion is less than about 10 µin (about 0.254 µm) RMS.

11. The earth-boring tool of claim 10, wherein the first surface roughness of the first portion is less than about 2 µin (about 0.0508 µm) RMS.

12. The earth-boring tool of claim 11, wherein the first surface roughness of the first portion is less than about 0.5 µin (about 0.0127 µm) RMS.

13. The earth-boring tool of claim 9, wherein the at least one recess extends to a depth of between 0.001 in and about 0.1 in into the volume of superabrasive material.

14. The earth-boring tool of claim 9, wherein the cutting face further comprises a substantially planar portion extending parallel to the planar surface of the at least one recess, the substantially planar portion circumscribing the at least one recess.

15. The earth-boring tool of claim 9, wherein the at least one recess comprises a radially inner edge having a sloped surface and extending between the planar surface and the domed surface, the radially inner edge of the at least one recess configured to fracture a chip of formation cuttings when the cutting element is used to cut a subterranean formation.

16. A method of forming a cutting element for an earth-boring tool, comprising:
forming a volume of superabrasive material having a cutting face comprising a domed surface extending outward from the cutting face and at least one recess extending into the volume of superabrasive material from the cutting face and encircling the domed surface, the at least one recess having a planar surface extending perpendicular to a longitudinal axis of the cutting element;
providing a first portion of the cutting face with a first surface roughness, wherein the first portion comprises at least a portion of the domed surface of the cutting face;
providing a second portion of the cutting face with a second surface roughness greater than the first surface roughness; and
configuring the domed surface of the cutting face to generate at least two discrete streams of formation cuttings when the cutting element is mounted to an earth-boring tool and used to cut a subterranean formation.

17. The method of claim 16, wherein providing the first portion of the cutting face with a first surface roughness comprises providing the first portion of the cutting face with a first surface roughness less than about 10 µin (about 0.254 µm) RMS.

18. The method of claim 16, wherein providing the first portion of the cutting face with a first surface roughness comprises providing the first portion of the cutting face with a first surface roughness less than about 2 µin (about 0.0508 µm) RMS.

19. The method of claim 18, wherein providing the first portion of the cutting face with a first surface roughness comprises polishing the first portion of the cutting face with a first surface roughness less than about 10 µin (about 0.254 µm) RMS.

20. The method of claim 16, wherein providing the first portion of the cutting face with a first surface roughness comprises using at least one of a lapping process, a dry, rotating diamond wheel process, a laser polishing process, an ion beam or chemical polishing process, or a diamond-like carbon coating process.

* * * * *